US012765284B2

(12) United States Patent
Ichikawa et al.

(10) Patent No.: US 12,765,284 B2
(45) Date of Patent: Oct. 13, 2026

(54) SILICON CARBIDE SEMICONDUCTOR DEVICE AND METHOD OF MANUFACTURING THE SAME

(71) Applicant: FUJI ELECTRIC CO., LTD., Kawasaki (JP)

(72) Inventors: Yoshihito Ichikawa, Matsumoto-city (JP); Akimasa Kinoshita, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 371 days.

(21) Appl. No.: 18/493,272

(22) Filed: Oct. 24, 2023

(65) Prior Publication Data

US 2024/0055258 A1 Feb. 15, 2024

Related U.S. Application Data

(63) Continuation of application No. PCT/JP2022/035875, filed on Sep. 27, 2022.

(30) Foreign Application Priority Data

Nov. 30, 2021 (JP) ................................ 2021-194214

(51) Int. Cl.
*H10P 32/10* (2026.01)
*H10D 12/00* (2025.01)
(Continued)

(52) U.S. Cl.
CPC ........... *H10P 32/18* (2026.01); *H10D 12/031* (2025.01); *H10D 30/665* (2025.01);
(Continued)

(58) Field of Classification Search
CPC ............... H01L 21/221; H01L 21/0465; H01L 21/26506; H10D 12/031; H10D 30/665;
(Continued)

(56) References Cited

U.S. PATENT DOCUMENTS 10,418,445 B2 9/2019 Ryo et al.
10,840,369 B2 11/2020 Okumura
(Continued)

FOREIGN PATENT DOCUMENTS

JP 2017-168506 A 9/2017
JP 2019-003969 A 1/2019
(Continued)

OTHER PUBLICATIONS

English Translation of International Search Report issued in International Application No. PCT/JP2022/035875 dated Dec. 13, 2022.
(Continued)

*Primary Examiner* — Herve-Louis Y Assouman

(57) ABSTRACT

A manufacturing method of a silicon carbide semiconductor device includes: epitaxially growing a drift layer of a first conductivity-type on a silicon carbide substrate of the first conductivity-type; forming a base region of a second conductivity-type on the drift layer; forming a main region of the first conductivity-type on the drift layer so as to be in contact with the base region; forming a gate insulating film so as to be in contact with the base region and the main region; forming a gate electrode so as to be in contact with the base region and the main region with the gate insulating film interposed; and forming a lifetime killer region at a depth covering a bottom surface of the drift layer by irradiating the top surface side of the drift layer with a lifetime killer after epitaxially growing the drift layer and before forming the gate insulating film.

17 Claims, 21 Drawing Sheets

(51) Int. Cl.

| | |
|---|---|
| ***H10D 12/01*** | (2025.01) |
| ***H10D 30/01*** | (2025.01) |
| ***H10D 30/60*** | (2025.01) |
| ***H10D 30/66*** | (2025.01) |
| ***H10D 62/10*** | (2025.01) |
| ***H10D 62/13*** | (2025.01) |
| ***H10D 62/17*** | (2025.01) |
| ***H10D 62/53*** | (2025.01) |
| ***H10D 62/81*** | (2025.01) |
| ***H10D 62/832*** | (2025.01) |
| ***H10P 30/20*** | (2026.01) |
| ***H10P 30/22*** | (2026.01) |

(52) U.S. Cl.
CPC ......... *H10D 30/668* (2025.01); *H10D 62/107* (2025.01); *H10D 62/109* (2025.01); *H10D 62/393* (2025.01); *H10D 62/53* (2025.01); *H10D 62/8325* (2025.01); *H10P 30/22* (2026.01); *H10P 32/171* (2026.01)

(58) Field of Classification Search
CPC .. H10D 30/668; H10D 62/107; H10D 62/109; H10D 62/393; H10D 62/53; H10D 62/8325; H10D 12/00; H10D 30/021; H10D 30/60; H10D 62/10; H10D 62/105; H10D 62/106; H10D 62/157; H10D 62/81; H10P 32/18; H10P 30/22; H10P 32/171; H10P 30/204; H10P 30/208
See application file for complete search history.

(56) References Cited

U.S. PATENT DOCUMENTS

| | | | | |
|---|---|---|---|---|
| 11,038,020 | B2 | 6/2021 | Fujimoto | |
| 11,069,529 | B2 | 7/2021 | Naito | |
| 11,637,182 | B2 | 4/2023 | Fujimoto | |
| 2017/0373141 | A1* | 12/2017 | Yoshida ............... | H10D 12/481 |
| 2018/0097069 | A1* | 4/2018 | Utsumi ................ | H10D 12/031 |
| 2018/0358444 | A1 | 12/2018 | Ryo et al. | |
| 2019/0165102 | A1 | 5/2019 | Fujimoto | |
| 2019/0172944 | A1 | 6/2019 | Okumura | |
| 2019/0326118 | A1 | 10/2019 | Naito | |
| 2020/0295129 | A1* | 9/2020 | Kinoshita .......... | H10D 62/8325 |
| 2021/0013339 | A1 | 1/2021 | Okumura | |
| 2021/0257455 | A1 | 8/2021 | Fujimoto | |
| 2023/0223443 | A1 | 7/2023 | Fujimoto | |

FOREIGN PATENT DOCUMENTS

| | | | |
|---|---|---|---|
| JP | 2019-102493 | A | 6/2019 |
| JP | 2019-102737 | A | 6/2019 |
| JP | 2020-191420 | A | 11/2020 |
| WO | 2019/013286 | A1 | 1/2019 |

OTHER PUBLICATIONS

Written Opinion issued in International Application No. PCT/JP2022/035875 dated Dec. 13, 2023.

* cited by examiner

| CONDITIONS | LIFETIME (1/e [μsec]) |
|---|---|
| 1750°C+1300°C | 0.0850 |
| 1300°C | 0.1050 |
| IMMEDIATELY AFTER IRRADIATION | 0.0800 |
| NO IRRADIATION | 0.2125 |

SILICON CARBIDE SEMICONDUCTOR DEVICE AND METHOD OF MANUFACTURING THE SAME

CROSS-REFERENCE TO RELATED APPLICATION

This application is a Continuation of PCT Application No. PCT/JP2022/035875, filed on Sep. 27, 2022, and claims the priority of Japanese Patent Application No. 2021-194214, filed on Nov. 30, 2021, the content of which are incorporated herein by reference.

BACKGROUND OF THE INVENTION

1. Field of the Invention

The present invention relates to a silicon carbide (SiC) semiconductor device and a method of manufacturing the same.

2. Description of the Related Art

Silicon carbide (SiC) single-crystal substrates on the market include many kinds of dislocations such as a basal plane dislocation (BPD). Such a dislocation is taken over to an epitaxial substrate obtained such that SiC single crystals are epitaxially grown on a substrate. It is thus known that the dislocation has an adverse effect on the characteristics of a semiconductor device provided on the epitaxial substrate.

A semiconductor device (a SiC semiconductor device) such as a MOS field effect transistor (FET) including SiC as semiconductor material includes an internal diode having a p-n junction in an epitaxial substrate. The basal plane dislocation causes deterioration of the forward characteristics of the internal diode that executes a bipolar operation when turned off. For example, minority carriers, such as holes in an n-type semiconductor, generated by forward conduction during a bipolar operation are diffused in the epitaxial substrate. When the minority carriers are recombined by the basal plane dislocation to lead recombination energy to be applied to the basal plane dislocation, a stacking fault extends inside the epitaxial substrate starting from the basal plane dislocation. The extension of the stacking fault leads to a rise of a forward voltage (an ON-voltage) to increase a forward resistance (an ON-resistance) when a forward current is led to flow through the internal diode. The deterioration of the element characteristics increases a loss caused with the passage of time and also increases the amount of generated heat, causing a failure of the semiconductor device accordingly.

The stacking fault extends from an interface between an n-type substrate and a drift layer that is an n-type epitaxially-grown layer. Arranging a recombination promotion layer of $n^+$-type having a high concentration between the substrate and the drift layer can recombine holes injected into the drift layer from the surface electrode side. In addition, it is known that an irradiation with a lifetime killer such as protons to form a lifetime killer region instead of the recombination promotion layer avoids the extension of the stacking fault. The irradiation with the lifetime killer is typically executed after a metal formation on the surface side, as in the case of a semiconductor substrate (a Si semiconductor device) including silicon (Si) as semiconductor material.

JP 2019-102493 A discloses that protons or the like are injected as a lifetime killer to a part adjacent to an interface between a SiC semiconductor substrate and an n-type boundary layer. JP 2019-003969 A discloses that protons or the like are implanted inside a p-type epitaxial layer on an n-type drift layer so as to form a lifetime killer region.

JP 2020-191420 A discloses a semiconductor device in which a low lifetime region having a minority carrier lifetime shorter than that of an $n^-$-type drift region is provided in at least a sense invalid region of a main invalid region.

The recombination promotion laver, when formed, is required to have a thickness of about 10 micrometers, and the manufacturing cost is thus increased. The lifetime killer, when used in the Si semiconductor device, typically has an influence on the minority carriers, but hardly has an influence on the majority carriers or on the ON-resistance of the MOSFET. However, the lifetime killer has an influence on the majority carriers when used in the SiC semiconductor device, and the ON-resistance of the MOSFET is increased particularly when the drift layer is irradiated with the lifetime killer.

In the Si semiconductor device, the irradiation with the lifetime killer is made from the rear surface side of the Si substrate into a depth so as to have a fewer influence on the gate insulating film. In the SiC semiconductor device, the SiC substrate has a greater thickness than the Si substrate, which leads to a variation in the thickness, while the drift layer epitaxially grown on the SiC substrate has a smaller thickness than the drift layer in the Si substrate. If the irradiation with the lifetime killer is made from the rear surface side of the SiC substrate in such a SiC semiconductor device, the lifetime killer would be distributed ununiformly in the drift layer, leading to a variation in the ON-resistance in the MOSFET accordingly.

SUMMARY OF THE INVENTION

In view of the foregoing problems, the present invention provides a SiC semiconductor device having a configuration capable of avoiding or decreasing a conduction deterioration of an internal diode and decreasing a variation in ON-resistance of an active element.

An aspect of the present invention inheres in a SiC semiconductor device including: a drift layer of a first conductivity-type provided on a top surface side of a silicon carbide substrate of the first conductivity-type; a base region of a second conductivity-type provided on a top surface side of the drift layer; a main region of the first conductivity-type provided on the top surface side of the drift layer so as to be in contact with the base region; an insulated gate electrode structure provided to be in contact with the main region and the base region; and a lifetime killer region provided to cover a bottom surface of the drift layer.

Another aspect of the present invention inheres in a method of manufacturing a SiC semiconductor device, including; epitaxially growing a drift layer of a first conductivity-type on a top surface side of a silicon carbide substrate of the first conductivity-type; forming a base region of a second conductivity-type on a top surface side of the drift layer; forming a main region of the first conductivity-type on the top surface side of the drift layer so as to be in contact with the base region; forming a gate insulating film so as to be in contact with the base region and the main region; forming a gate electrode so as to be in contact with the base region and the main region with the gate insulating film interposed: and forming a lifetime killer region at a depth covering a bottom surface of the drift layer by irradiating the top surface side of the drift layer with a lifetime killer after the epitaxially growing the drift layer and before the forming the gate insulating film.

DETAILED DESCRIPTION

Figure 1:
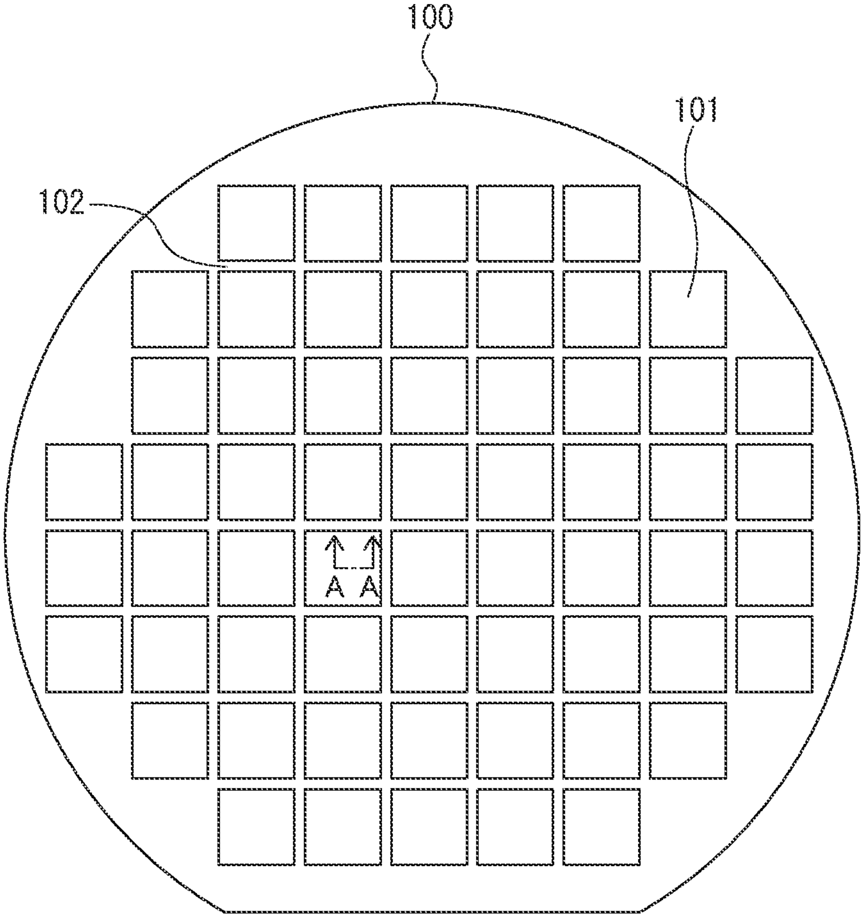
FIG. 1 is a schematic plan view illustrating an example of a SiC semiconductor device according to a first embodiment.

With reference to the drawings, first to third embodiments of the present invention will be described below.

In the drawings, the same or similar elements are indicated by the same or similar reference numerals, and overlapping explanations are not repeated. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The first to third embodiments described below merely illustrate schematically devices and methods for specifying and giving shapes to the technical idea of the present invention, and the span of the technical idea is not limited to materials, shapes, structures, and relative positions of elements described herein.

As used in the present specification, a source region of a metal-oxide-semiconductor field-effect transistor (MOSFET) is referred to as "one of the main regions (a first main region)" that can be used as an emitter region of an insulated gate bipolar transistor (IGBT). The "one of the main regions", when provided in a thyristor such as a MOS controlled static induction thyristor (SI thyristor), can be used as a cathode region. A drain region of the MOS transistor is referred to as the "other one of the main regions (a second main region)" of the semiconductor device that can be used as a collector region in the IGBT or as an anode region in the thyristor. The term "main region", when simply mentioned in the present specification, is referred to as either the first main region or the second main region that is determined as appropriate by the person skilled in the art.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity-type is an n-type and a second conductivity-type is a p-type. However, the relationship of the conductivity types may be inverted to set the first conductivity-type to the p-type and the second conductivity-type to the n-type. Further, a semiconductor region denoted by the symbol "n" or "p" attached with "+" indicates that such semiconductor region has a relatively high impurity concentration or a relatively low specific resistance as compared to a semiconductor region denoted by the symbol "n" or "p" without "+". A semiconductor region denoted by the symbol "n" or "p" attached with "−" indicates that such semiconductor region has a relatively low impurity concentration or a relatively high specific resistance as compared to a semiconductor region denoted by the symbol "n" or "p" without "−". However, even when the semiconductor regions are denoted by the same reference symbols "n" and "n", it is not indicated that the semiconductor regions have exactly the same impurity concentration or the same specific resistance.

In addition, a crystal polymorphism is present in SiC crystals, and main examples include 3C of a cubic crystal, and 4H and 6H of a hexagonal crystal. A bandgap at room temperature is reported that is 2.23 eV in 3C—SiC, 3.26 eV in 4H—SiC, and 3.02 eV in 6H—SiC. The following embodiments are illustrated with a case of using 4H—SiC.

First Embodiment

<Structure of SiC Semiconductor Device>

A SiC semiconductor device according to a first embodiment is manufactured by use of a SiC semiconductor substrate (a substrate) 100, as illustrated in FIG. 1. The substrate 100 includes a plurality of chip regions 101 and dicing lines 102. The respective chip regions 101 have a rectangular planar shape so as to be arranged in a matrix form in the substrate 100, for example. The dicing lines 102 are provided in a lattice state so as to surround the respective chip regions 101.

Figure 2:
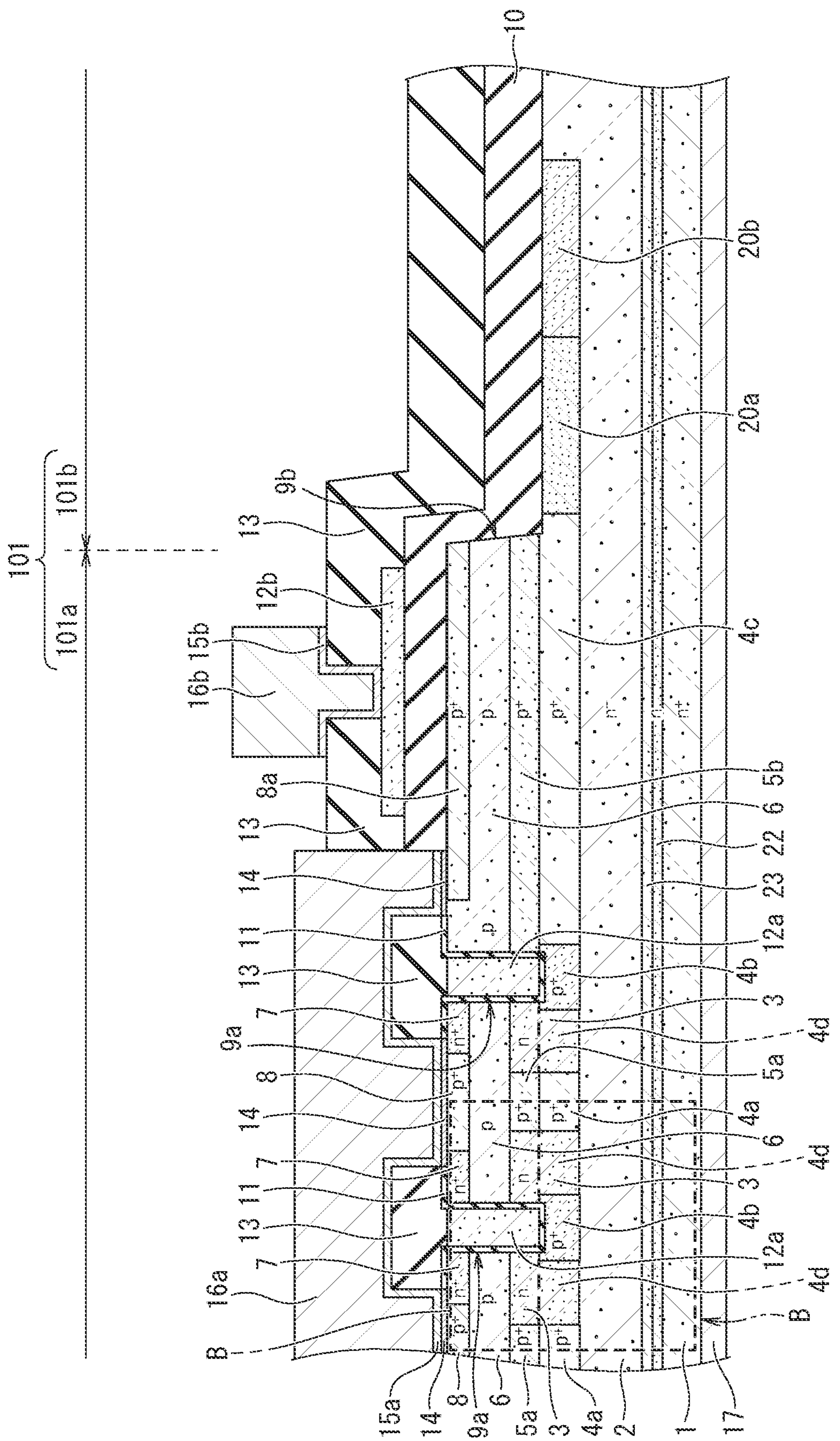
FIG. 2 is a schematic cross-sectional view as viewed from A-A line in FIG. 1.

As illustrated in FIG. 2, the respective chip regions 101 include an active region 101*a* including an active element, and an edge termination region (an outer circumferential part) 101*b* provided at the circumference of the active region 101*a* and having a voltage blocking structure. FIG. 2 illustrates a case in which the active region 101*a* includes a MOSFET as an active element having a trench gate structure provided at the upper part of a drift layer 2 of a first conductivity-type ($n^-$-type), and the edge termination region 101*b* includes electric-field relaxation regions 20*a* and 20*b* implementing the voltage blocking structure.

The drift layer 2 is an epitaxially-grown layer including SiC. The drift layer 2 has an impurity concentration in a range of about $1\times10^{15}$ $cm^{-3}$ or greater and $2\times10^{16}$ $cm^{-3}$ or less, and has a thickness in a range of about one micrometer or greater and several hundreds of micrometers or smaller, for example. The impurity concentration and the thickness of the drift layer 2 can be adjusted as appropriate depending on the breakdown-voltage specifications of an internal diode described below.

A base region 6 of a second conductivity-type (p-type) is provided on the top surface of the drift layer 2. The base region 6 is an epitaxially-grown layer including SiC. The base region 6 has an impurity concentration in a range of about $1\times10^{17}$ $cm^{-3}$ or greater and $1\times10^{18}$ $cm^{-3}$ or less, for example.

A base contact region 8 of $p^+$-type having a higher impurity concentration than the base region 6 is provided selectively at the upper part of the base region 6. The base contact region 8 has an impurity concentration in a range of about $5\times10^{18}$ $cm^{-3}$ or greater and $5\times10^{20}$ $cm^{-3}$ or less, for example.

A first main region (a source region) 7 of $n^+$-type having a higher impurity concentration than the drift layer 2 is provided selectively at the upper part of the base region 6 so as to be in contact with the base contact region 8. The source region 7 has an impurity concentration in a range of about $5\times10^{18}$ $cm^{-3}$ or greater and $5\times10^{20}$ $cm^{-3}$ or less, for example.

A plurality of trenches 9*a* are provided to penetrate the base region 6 from the respective top surfaces of the source region 7 and the base region 6. The trenches 9*a* each have a width of about one micrometer or smaller, for example. The source region 7 and the base region 6 are in contact with the side surfaces of the trenches 9*a*. A gate insulating film 11 is deposited along the bottom surfaces and the side surfaces of the trenches 9*a*. A gate electrode 12*a* is buried in the respective trenches 9*a* with the gate insulating film 11 interposed. The gate insulating film 11 and the gate electrode 12*a* implement an insulated gate electrode structure (11, 12*a*).

The gate insulating film 11 as used herein can be a silicon dioxide film (a $SiO_2$ film) or a single film of a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, or a bismuth oxide ($Bi_2O_3$) film, or a composite film including some of the above films stacked on one another. The gate electrode 12*a* can be made of a polysilicon layer (a doped polysilicon layer) heavily doped with impurity ions such as phosphorus (P) or boron (B), for example.

A current spreading layer (CSL) 3 of n-type having a higher impurity concentration than the drift layer 2 is deposited selectively at the upper part of the drift layer 2. The top surface of the current spreading layer 3 is in contact with the bottom surface of the base region 6. The current spreading layer 3 has an impurity concentration in a range of about $5\times10^{16}$ $cm^{-3}$ or greater and $5\times10^{17}$ $cm^{-3}$ or less, for example. The respective bottoms of the trenches 9*a* reach the current spreading layer 3. The preset embodiment does not necessarily include the current spreading layer 3. The respective bottoms of the trenches 9*a* reach the drift layer 2 when the current spreading layer 3 is not provided.

A gate bottom protection region 4*b* of $p^+$-type is provided inside the current spreading layer 3 so as to be in contact with the respective bottoms of the trenches 9*a*. The gate bottom protection region 4*b* has an impurity concentration in a range of about $1\times10^{17}$ $cm^{-3}$ or greater and $1\times10^{19}$ $cm^{-3}$ or less, for example.

A first buried region 4*a* of $p^+$-type is provided separately from the gate bottom protection region 4*b* inside the current spreading layer 3 under the base contact region 8 at substantially the same depth as the gate bottom protection region 4*b*. A second buried region 5*a* of $p^+$-type is provided at the upper part of the current spreading layer 3 so as to be in contact with the top surface of the first buried region 4*a* and the bottom surface of the base region 6. The second buried region 5*a* is also provided under the base contact region 8. The first buried region 4*a* and the second buried region 5*a* implement a base bottom buried region (4*a*, 5*a*). A connection part 4*d* of $p^+$-type is selectively provided so as to connect the first buried region 4*a* and the gate bottom protection region 4*b* to each other in the backward direction of the trenches 9*a* illustrated in FIG. 2. The first buried region 4*a*, the second buried region 5*a*, and the connection part 4*d* each have an impurity concentration in a range of about $1\times10^{17}$ $cm^{-3}$ or greater and $1\times10^{19}$ $cm^{-3}$ or less, for example.

An interlayer insulating film 13 is provided on the top surface of the gate electrode 12*a*. The interlayer insulating film 13 as used herein is a borophosphosilicate glass film (a BPSG film). The interlayer insulating film 13 may be a phosphosilicate glass film (a PSG film), a non-doped $SiO_2$ film without containing phosphorus (P) or boron (B) which is referred to as a non-doped silicate glass (NSG) film, a borosilicate glass film (a BSG film), or a silicon nitride ($Si_3N_4$) film, or a stacked layer of the above films stacked on one another.

A source contact layer 14 is deposited on the source region 7 and the base contact region 8 exposed between the regions of the interlayer insulating film 13. A barrier metal layer 15*a* is deposited to cover the interlayer insulating film 13 and the source contact layer 14. A first main electrode (a source electrode) 16*a* is electrically connected to the source region 7 and the base contact region 8 via the barrier metal layer 15*a* and the source contact layer 14. The source contact layer 14 can be made of a nickel silicide ($NiSi_x$) film, the barrier metal layer 15*a* can be made of a titanium nitride (TiN) film or a titanium (Ti) film, and the source electrode 16*a* can be made of an aluminum (Al) film or an aluminum-silicon (Al—Si) film, for example. The source electrode 16*a* is provided separately from a gate surface electrode (not illustrated) electrically connected to the gate electrode 12*a*.

A buffer layer (a dislocation conversion layer) 22 of n-type having a higher impurity concentration than the drift layer 2 is provided under the drift layer 2. The dislocation conversion layer 22 has a function of converting a basal plane dislocation as a starting point of extension of a stacking fault into a threading dislocation that does not extend into the stacking fault. The dislocation conversion layer 22 has an impurity concentration in a range of about $5\times10^{17}$ $cm^{-3}$ or greater and $1\times10^{18}$ $cm^{-3}$ or less, and has a thickness in a range of about 0.5 micrometers or greater and 1 micrometer or smaller, for example. A lifetime killer region 23 is interposed between the drift layer 2 and the dislocation conversion layer 22. The lifetime killer region 23 is described in detail below.

A second main region (a drain region) 1 of $n^+$-type having a higher impurity concentration than the dislocation conversion layer 22 is deposited on the bottom surface of the dislocation conversion layer 22. The drain region 1 is a SiC semiconductor substrate (a substrate). The drain region 1 has an impurity concentration in a range of about $1\times10^{18}$ $cm^{-3}$ or greater and $1\times10^{19}$ $cm^{-3}$ or less, for example.

A second main electrode (a drain electrode) 17 is deposited on the bottom surface of the drain region 1. The drain electrode 17 as used herein can be a single film including gold (Au) or a metal film in which Ti, nickel (Ni), and Au are stacked in this order, and a metal film including molybdenum (Mo) or tungsten (W) may be further stacked together as a lowermost layer. A drain contact layer such as a nickel silicide ($NiSi_x$) film may be provided between the drain region 1 and the drain electrode 17.

A base contact region 8*a* is provided at the upper part of the base region 6 in the active region 101*a* toward the edge termination region 101*b*. A wiring layer 12*b* is deposited on the top surface of the base contact region 8*a* with a field oxide film 10 interposed. A gate electrode pad 16*b* is provided on the top surface of the wiring layer 12*b* with a barrier metal layer 15*b* interposed. Although not illustrated, the gate electrode pad 16*b* is electrically connected to the gate electrode 12*a* via the wiring layer 12*b*. The interlayer insulating film 13 and the field oxide film 10 are elongated into the edge termination region 101*b*.

A base bottom buried region (4*c*, 5*b*) implemented by a first buried region 4*c* and a second buried region 5*b* is elongated in the active region 101*a* toward the edge termination region 101*b* so as to be in contact with the bottom surface of the base region 6. The first buried region 4*c* is arranged to be in contact with the top surface of the drift layer 2. The second buried region 5*b* is arranged to be in contact with the top surface of the first buried region 4*c* and the bottom surface of the base region 6.

A mesa groove (a recess) 9*b* is provided in the edge termination region 101*b* so as to penetrate the base region 6 from the top surface side to reach the first buried region 4*c*. A width of the mesa groove 9*b* in each chip region 101 is in a range of about 5 micrometers or greater and 200 micrometers or smaller, for example.

The edge termination region 101*b* is provided with electric-field relaxation regions 20*a* and 20*b* as a termination structure so as to be exposed on the bottom of the mesa groove 9*b*. The electric-field relaxation regions 20*a* and 20*b* are each a junction termination extension (JTE) structure, for example, and are provided with a plurality of spatial modulation parts of p-type. The respective electric-field relaxation regions 20*a* and 20*b* are not limited to the JTE structure, and may have a structure including a plurality of guard rings of p-type arranged into a concentric ring-like state. The outer-side end part of the edge termination region 101*b* may be provided with channel stoppers of $n^+$-type or $p^+$-type arranged into a concentric ring-like state at the upper part of the drift layer 2.

The SiC semiconductor device according to the first embodiment during the operation applies a positive voltage to the drain electrode 17 while using the source electrode 16*a* as a earth potential, and causes an inversion layer (a channel) to be formed in the base region 6 toward the side surface of the respective trenches 9*a* so as to be in the ON-state when a positive voltage of a threshold or greater is applied to the gate electrode 12*a*. The inversion layer is formed on the surface of the base region 6 exposed on the side surface of the respective trenches 9*a* that is the interface between the base region 6 and the gate insulating film 11 interposed between the base region 6 and the gate electrode 12*a*. In the ON-state, a current flows from the drain electrode 17 toward the source electrode 16*a* through the drain region 1, the dislocation conversion layer 22, the drift layer 2, the current spreading layer 3, the inversion layer of the base region 6, and the source region 7. When the voltage applied to the gate electrode 12*a* is smaller than the threshold, the SiC semiconductor device is led to be the OFF-state since no inversion channel is formed in the base region 6, and no current flows from the drain electrode 17 toward the source electrode 16*a*.

Figure 3:
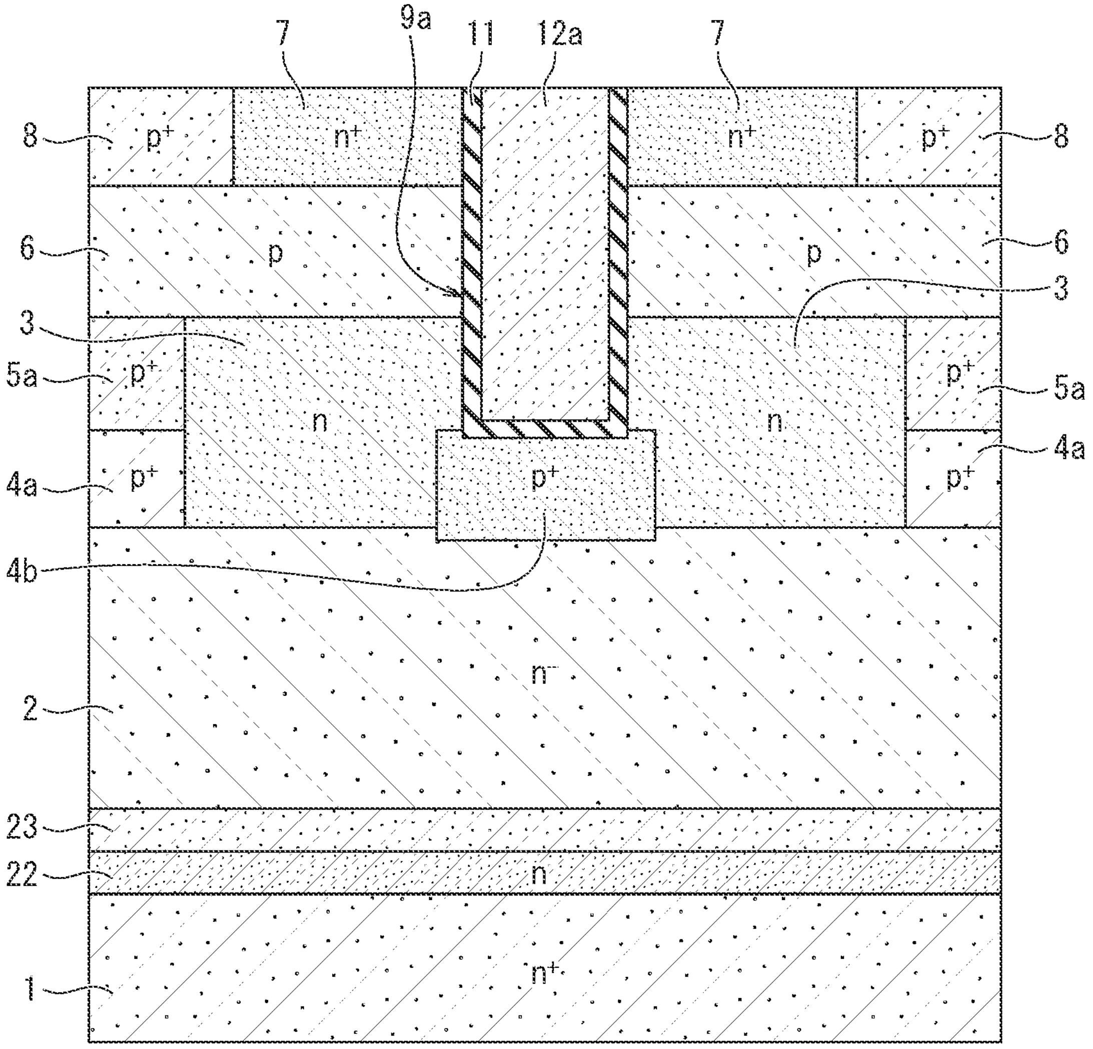
FIG. 3 is an enlarged view of region B in FIG. 2.

FIG. 3 is an enlarged view of part B in the semiconductor device illustrated in FIG. 2. As illustrated in FIG. 2 and FIG. 3, the formation of the p-type base region 6 at the upper part of the $n^-$-type drift layer 2 provides an internal diode (a body diode) having a p-n junction. In particular, the $p^+$-type base contact region 8, the p-type base region 6, and the $p^+$-type base bottom buried region (4*a*, 5*a*) each function as an anode region of the internal diode, and the $n^+$-type drain region 1 functions as a cathode region of the internal diode. The n-type current spreading layer 3 and the $n^-$-type drift layer 2 each function as a traveling region in which majority carriers (electrons) supplied from the drain region 1 drift. Minority carriers (holes) are injected into the drift layer 2 through the base region 6 from the base contact region 8 side.

The holes injected into the drift layer 2 could reach the drain region 1 through the dislocation conversion layer 22 at a sufficiently high density. The stacking fault is led to extend inside the drift layer 2 starting from the basal plane dislocation locally present adjacent to the interface between the dislocation conversion layer 22 and the drain region 1. Since the stacking fault turns to be a high-resistance region, a current is to flow through a region having no stacking fault.

This would cause deterioration of the forward characteristics such as an increase in forward voltage (ON-voltage) or ON-resistance in the internal diode.

To deal with the problem described above, the SiC semiconductor device according to the first embodiment includes the lifetime killer region 23 arranged between the drift layer 2 and the dislocation conversion layer 22, as illustrated in FIG. 2 and FIG. 3. The lifetime killer region 23 is provided to cover the bottom surface of the drift layer 2, which is the interface between the drift layer 2 and the dislocation conversion layer 22. The lifetime killer region 23 has a crystal defect as a recombination center for recombining the holes of the minority carriers, and is a region in which a lifetime of the holes of the minority carriers is shorter than that in the drift layer 2. The crystal defect is a point defect made by protons (hydrogen) or helium ions implanted. An area density of hydrogen or helium is in a range of about $5\times10^{10}$ $cm^{-2}$ or greater and $2\times10^{12}$ $cm^{-2}$ or less, for example. The lifetime killer region 23 has a thickness in a range of about 0.2 micrometers or greater and 5 micrometers or smaller.

Figure 4:
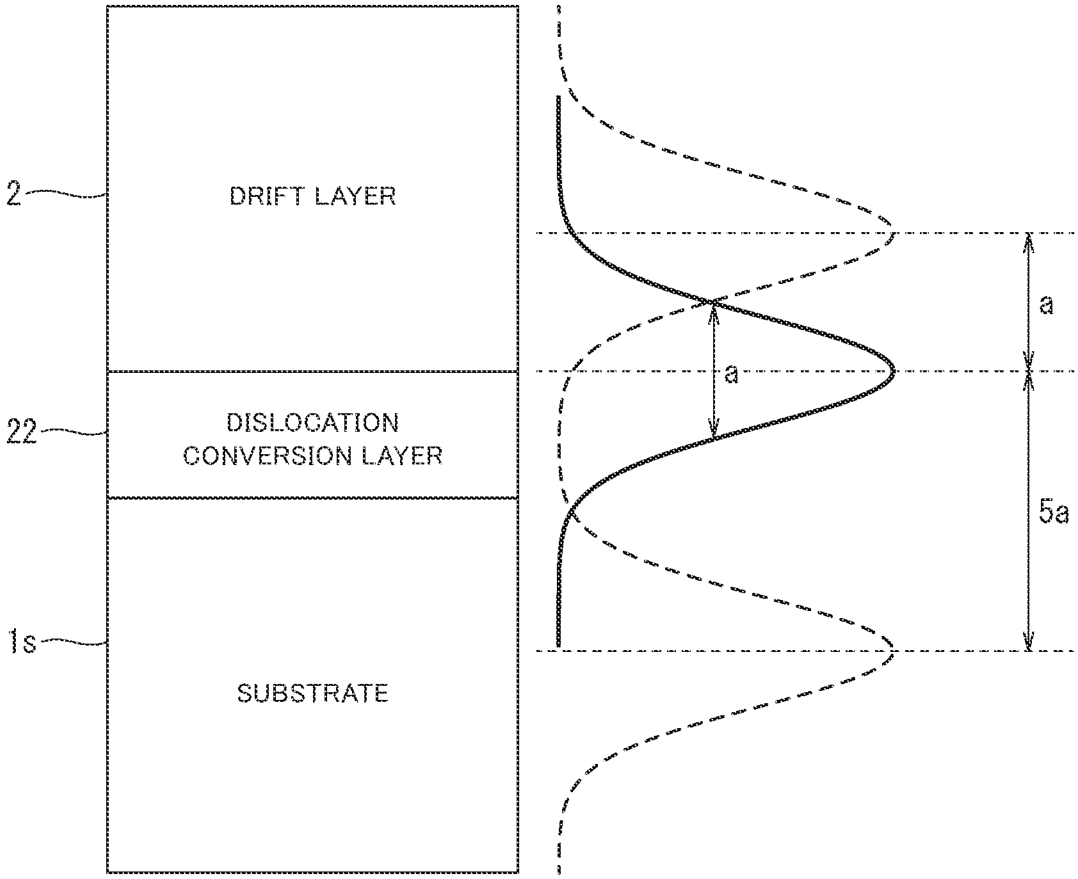
FIG. 4 is a schematic view illustrating an irradiation range of a lifetime killer in the SiC semiconductor device according to the first embodiment.

The position of the lifetime killer region 23 to be formed in the depth direction is described below with reference to FIG. 4. FIG. 4 on the left side schematically illustrates a positional relation in the depth direction between the substrate 1*s* of the drain region 1, the dislocation conversion layer 22, and the drift layer 2 before the lifetime killer region 23 is formed. As illustrated on the left side in FIG. 4, the bottom surface of the dislocation conversion layer 22 is in contact with the top surface of the substrate 1*s*, and the top surface of the dislocation conversion layer 22 is in contact with the bottom surface of the drift layer 2.

FIG. 4 on the right side schematically shows a concentration profile of the point defect made by hydrogen or helium included in the lifetime killer region 23 in the depth direction corresponding to the left side in FIG. 4. When the dislocation conversion layer 22 is provided between the substrate 1*s* and the drift layer 2 as illustrated on the left side in FIG. 4, a peak of concentration of the point defect made by hydrogen or helium in the depth direction is preferably located at a position inside the dislocation conversion layer 22 deeper than the interface between the dislocation conversion layer 22 and the drift layer 2. Adjusting the peak to this position can avoid an influence of hydrogen or helium on the gate insulating film 11 while allowing the lifetime killer region 23 to sufficiently ensure the function of recombining the holes.

The broken line shown on the right side in FIG. 4 indicates an allowable maximum displacement width of the peak position of concentration of the point defect made by hydrogen or helium included in the lifetime killer region 23 in the depth direction. In particular, the peak position of concentration of the point defect made by hydrogen or helium in the depth direction can be set within a range from a position inside the drift layer 2 shallower than the interface between the dislocation conversion layer 22 and the drift layer 2 by full width at half maximum (FWHM) “a” of the concentration of the point defect made by hydrogen or helium to a position inside the substrate 1*s* deeper than the interface between the dislocation conversion layer 22 and the drift layer 2 by five times as large as the full width at half maximum “a”. The full width at half maximum “a” can be regulated such that a thickness of a shielding layer used upon the irradiation with hydrogen or helium and an acceleration voltage of hydrogen or helium are adjusted.

Method of Manufacturing Semiconductor Device

An example of a method of manufacturing the SIC semiconductor device according to the first embodiment is described below with reference to FIG. 5 to FIG. 15. It should be understood that the method of manufacturing the SiC semiconductor device described below is an example, and the SiC semiconductor device can be manufactured by other methods including modified examples of this embodiment within the scope of the appended claims.

Figure 5:
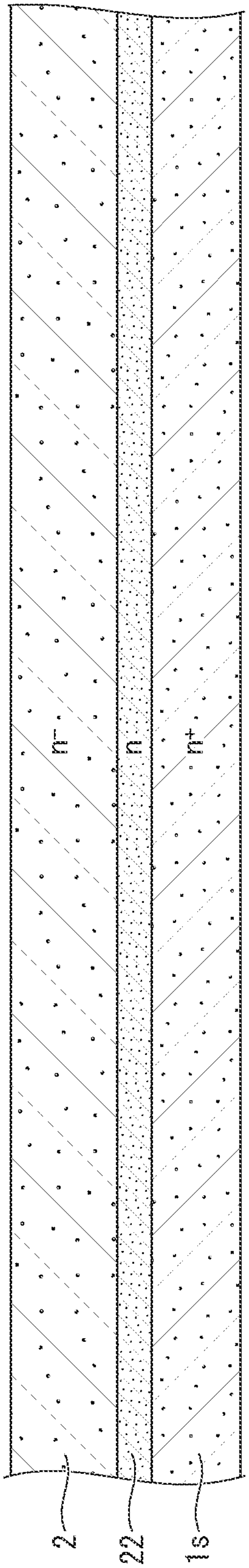
FIG. 5 is a schematic cross-sectional view for explaining an example of a method of manufacturing the SiC semiconductor device according to the first embodiment.

First, the SiC semiconductor substrate (the substrate) 1*s* of $n^+$-type doped with n-type impurity ions such as nitrogen (N) is prepared. The buffer layer (the dislocation conversion layer) 22 including SiC of n-type doped with n-type impurity ions such as N and having a lower impurity concentration than the substrate 1*s* is then epitaxially grown on the top surface of the substrate 1*s*, as illustrated in FIG. 5. Further, the drift layer 2 including SiC of $n^-$-type doped with n-type impurity ions such as N and having a lower impurity concentration than the dislocation conversion layer 22 is then epitaxially grown on the top surface of the dislocation conversion layer 22.

Figure 6:
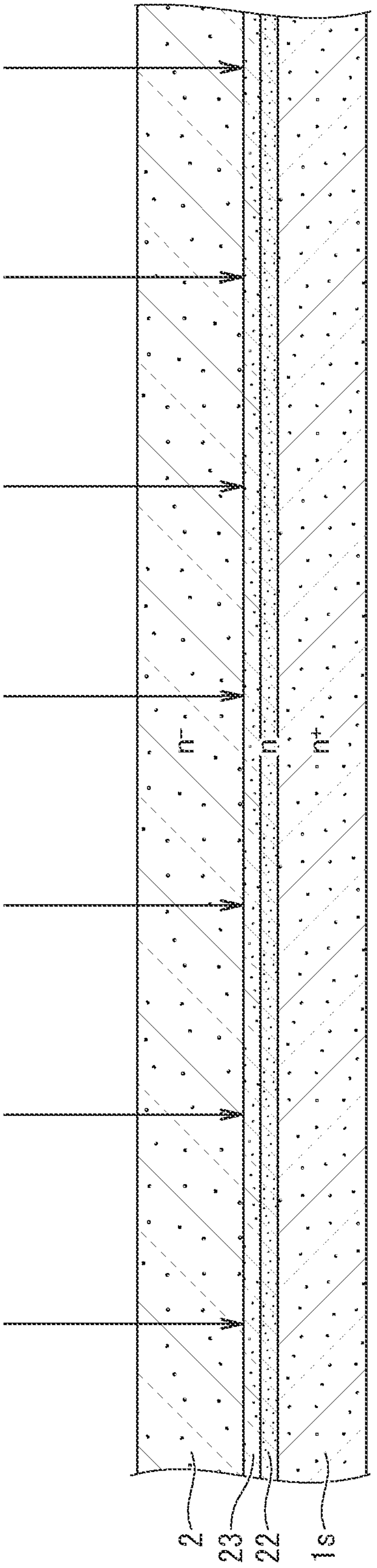
FIG. 6 is a schematic cross-sectional view continued from FIG. 5, for explaining the example of the method of manufacturing the SiC semiconductor device according to the first embodiment.

Next, as illustrated in FIG. 6, the entire top surface of the drift laver 2 is irradiated with protons (hydrogen (H) ions) or helium (He) ions from the top surface side of the drift layer 2. FIG. 6 schematically indicates the irradiation with the protons or helium ions by the arrows. The dose of the protons or helium ions is in a range of about $1\times10^{10}$ $cm^{-2}$ or greater and $2\times10^{12}$ $cm^{-2}$ or smaller, and the acceleration voltage is in a range of about 0.1 MeV or greater and 25 MeV or smaller, for example. Multiple ion implantation is executed upon the irradiation at a low acceleration, w % bile single ion implantation is executed upon the irradiation at a high acceleration, so as to adjust a distribution of the impurity ions irradiated in the depth direction. The multiple ion implantation at the low acceleration can accurately control the position of the point defect. The single ion implantation at the high acceleration can reduce the irradiation time. The lifetime killer region 23 having a flat surface is thus uniformly formed so as to cover the interface between the dislocation conversion layer 22 and the drift layer 2. The thickness of the drift layer 2 in the SIC semiconductor device is about 10 micrometers, for example, which is thinner than a drift layer in a Si semiconductor device typically having a thickness of about 100 micrometers, so as to irradiate the interface between the dislocation conversion layer 22 and the drift layer 2 with the protons or helium ions from the top surface side of the drift layer 2 with high accuracy.

Figure 7:
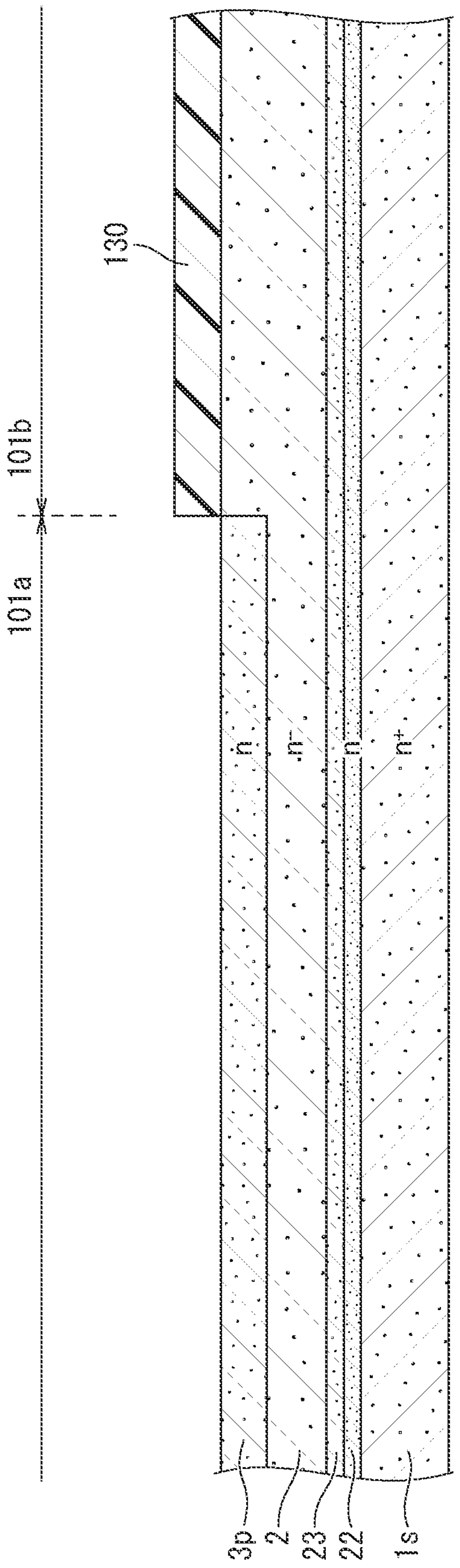
FIG. 7 is a schematic cross-sectional view continued from FIG. 6, for explaining the example of the method of manufacturing the SiC semiconductor device according to the first embodiment.

Next, a photoresist film 130 (refer to FIG. 7) is applied to the top surface of the drift layer 2, and is delineated by photolithography or the like. Using the delineated photoresist film 130 as a mask for ion implantation, the multiple ion implantation with n-type impurity ions such as nitrogen (N) is made selectively into the drift layer 2 in the active region 101*a* from the top surface side of the drift layer 2. This step provides an n-ion implantation layer 3*p* at the upper part of the drift layer 2 in the active region 101*a*, as illustrated in FIG. 7. The photoresist film 130 is then removed.

Next, an oxide film 140 (refer to FIG. 8) is deposited on the respective top surfaces of the n-ion implantation layer 3*p* and the drift layer 2 by chemical vapor deposition (CVD) or the like. A photoresist film is then applied to the top surface of the oxide film 140, and is delineated by photolithography and dry etching, for example. Using the delineated oxide film 140 as a mask for ion implantation, the multiple ion implantation with p-type impurity ions such as aluminum (Al) is made into the n-ion implantation layer 3*p*. This step provides the $p^+$-type first buried regions 4*a* and 4*c* and the $p^+$-type gate bottom protection region 4*b* selectively inside the n-ion implantation layer 3*p*, as illustrated in FIG. 8.

Figure 8:
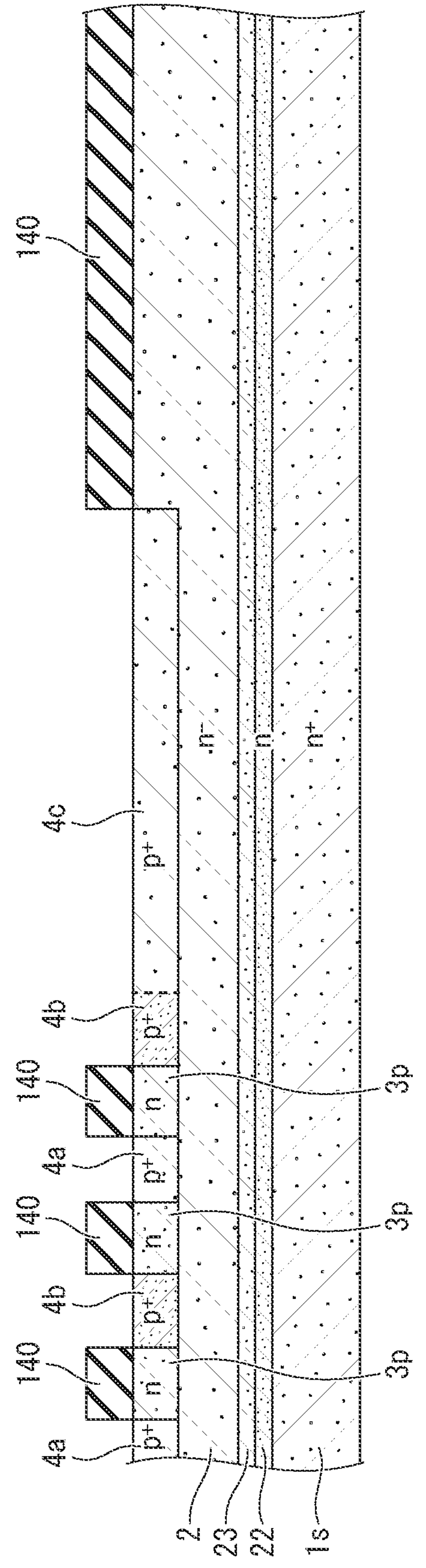
FIG. 8 is a schematic cross-sectional view continued from FIG. 7, for explaining the example of the method of manufacturing the SiC semiconductor device according to the first embodiment.

Although not illustrated in FIG. 8, the connection part 4*d* illustrated in FIG. 2 is also formed simultaneously. The oxide film 140 is then removed.

Next, an epitaxially-grown layer 5*e* (refer to FIG. 9) including SiC of n-type is grown on the respective top surfaces of the first buried regions 4*a* and 4*c*, the gate bottom protection region 4*b*, and the drift layer 2. A photoresist film is then applied on the top surface of the epitaxially-grown layer 5*e*, and is delineated by photolithography or the like. Using the delineated photoresist film as a mask for ion implantation, the multiple ion implantation with n-type impurity ions such as nitrogen (N) is made selectively into the upper part of the epitaxially-grown layer 5*e* in the active region 101*a* from the top surface side of the epitaxially-grown layer 5*e* so as to form an n-ion implantation layer 5*p* (refer to FIG. 9). The photoresist film used as the mask for ion implantation is then removed.

Figure 9:
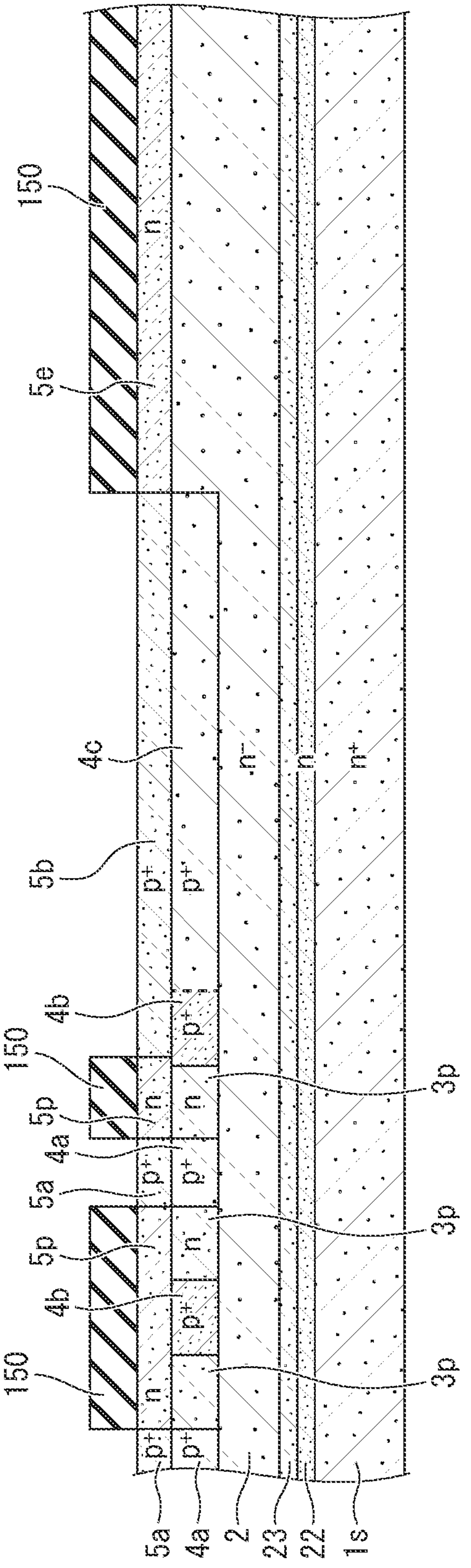
FIG. 9 is a schematic cross-sectional view continued from FIG. 8, for explaining the example of the method of manufacturing the SiC semiconductor device according to the first embodiment t.

Next, an oxide film 150 (refer to FIG. 9) is deposited on the respective top surfaces of the n-ion implantation layer 5*p* and the epitaxially-grown layer 5*e* by CVD or the like. A photoresist film is then applied to the top surface of the oxide film 150, and the oxide film 150 is delineated by photolithography and dry etching, for example. Using the delineated oxide film 150 as a mask for ion implantation, the multiple ion implantation with p-type impurity ions such as aluminum (Al) is made selectively into the n-ion implantation layer 5*p*. This step provides the second buried regions 5*a* and 5*b* selectively in the regions of the n-ion implantation layer 5*p* corresponding to the parts on the first buried regions 4*a* and 4*c*, as illustrated in FIG. 9. The oxide film 150 is then removed.

Next, an epitaxially-grown layer 6*p* of p-type (refer to FIG. 10) is epitaxially grown on the respective top surfaces of the second buried regions 5*a* and 5*b*, the n-ion implantation layer 5*p*, and the epitaxially-grown layer 5*e*. An oxide film is further deposited on the surface of the epitaxially-grown layer 6*p* thus obtained by CVD or the like. A photoresist film is then applied on the top surface of the oxide film, and the oxide film is delineated by photolithography and dry etching, for example. Using the delineated oxide film as a mask for etching, a part of the epitaxially-grown layer 6*p* and the second buried region 5*b*, and the epitaxially-grown layer 5*e* in the edge termination region 101*b* are selectively subjected to etching by dry etching or the like. The oxide film used as the mask for etching is then removed.

Figure 10:
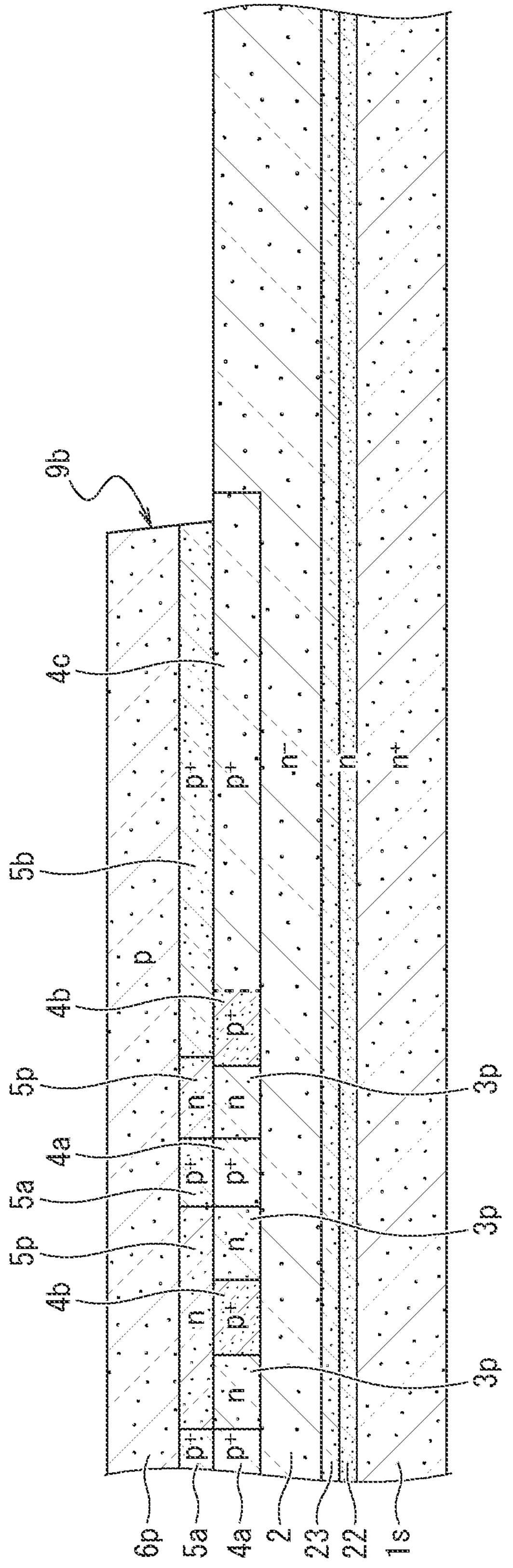
FIG. 10 is a schematic cross-sectional view continued from FIG. 9, for explaining the example of the method of manufacturing the SiC semiconductor device according to the first embodiment.

This step provides the mesa groove (the recess) 9*b* in the edge termination region 101*b*, as illustrated in FIG. 10. The end part of the first buried region 4*c* and the top surface of the drift layer 2 are exposed on the bottom of the mesa groove 9*b*. The epitaxially-grown layer 6*p*, the second buried region 5*a*, the n-ion implantation layer 5*p*, and the second buried region 5*b* still remain in the active region 101*a*.

Next, an oxide film is deposited on the top surface of the epitaxially-grown layer 6*p* and the bottom of the mesa groove 9*b* by CVD or the like. A photoresist film is then applied to the top surface of the oxide film, and the oxide film is delineated by photolithography and dry etching, for example. Using the delineated oxide film as a mask for ion implantation, the multiple ion implantation with n-type impurity ions such as phosphorus (P) is made into the epitaxially-grown layer 6*p* from the top surface side of the epitaxially-grown layer 6*p*. This step provides an n-ion implantation layer at the upper part of the epitaxially-grown layer 6*p* in the active region 101*a*.

After the removal of the oxide film used as the mask for ion implantation, an oxide film is deposited on the top surface of the n-ion implantation layer and the bottom of the mesa groove 9*b* by CVD or the like. A photoresist film is then applied on the top surface of the oxide film, and the oxide film is delineated by photolithography and dry etching, for example. Using the delineated oxide film as a mask for ion implantation, the multiple ion implantation with p-type impurity ions such as aluminum (Al) is made selectively into the n-ion implantation layer from the top surface side of the n-ion implantation layer. The oxide film used as the mask for ion implantation is then removed. The regions of the n-ion implantation layer into which the p-type impurity ions are implanted is to serve as the base contact region 8 and the base contact region 8*a*, while the other region of the n-ion implantation layer that remains without the p-type impurity ions implanted is to serve as the source region 7.

Figure 11:
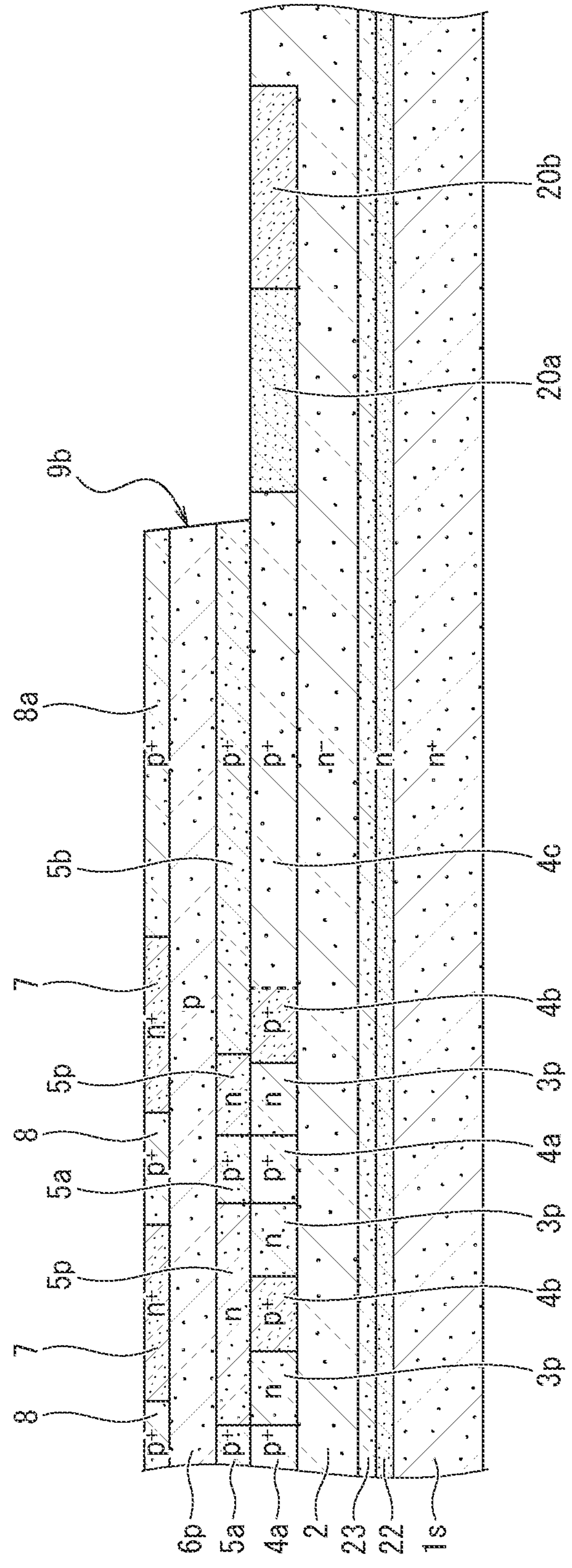
FIG. 11 is a schematic cross-sectional view continued from FIG. 10, for explaining the example of the method of manufacturing the SiC semiconductor device according to the first embodiment.

Next, a photoresist film is applied to the respective top surfaces of the source region 7, the base contact region 8, and the base contact region 8*a*, and the bottom of the mesa groove 9*b*, and is delineated by photolithography or the like. Using the delineated photoresist film as a mask for ion implantation, the multiple ion implantation with p-type impurity ions such as aluminum (Al) is made selectively into the bottom of the mesa groove 9*b* from the top surface side of the mesa groove 9*b*. The photoresist film used as the mask for ion implantation is then removed. This step provides the source region 7 and the respective base contact regions 8 and 8*a* at the upper part of the base region 6, as illustrated in FIG. 11. In addition, the electric-field relaxation regions 20*a* and 20*b* are formed as a termination structure so as to be exposed on the bottom of the mesa groove 9*b*.

Next, the p-type impurity ions or the n-type impurity ions implanted into the first buried regions 4*a* and 4*b*, the gate bottom protection region 4*b*, the second buried regions 5*a* and 5*b*, the source region 7, the base contact regions 8 and 8*a*, the electric-field relaxation regions 20*a* and 20*b*, and the like are collectively activated by activation annealing (heat treatment) in the state illustrated in FIG. 11. The temperature during the activation annealing is in a range of about 1600° C. or higher and 1800° C. or lower, for example, which is the highest temperature during the procedure of the manufacturing method for the SiC semiconductor device according to the first embodiment. While the present embodiment is illustrated with the case of executing the single activation annealing collectively after all of the ion implantation steps, the activation annealing may be executed every time after the respective ion implantation steps are executed.

The lifetime killer region 23 still remains even after the execution of the activation annealing, while the defect included in the lifetime killer region 23 is not sufficiently recovered. Since SiC has a greater band gap than Si, and a level is formed by the irradiation with the protons or helium ions, the present embodiment uses such characteristics in view of a principle in which the level formed in the band gap is not recovered at the temperature of about 1600° C. or higher and 1800° C. or lower during the activation annealing.

Figure 12:
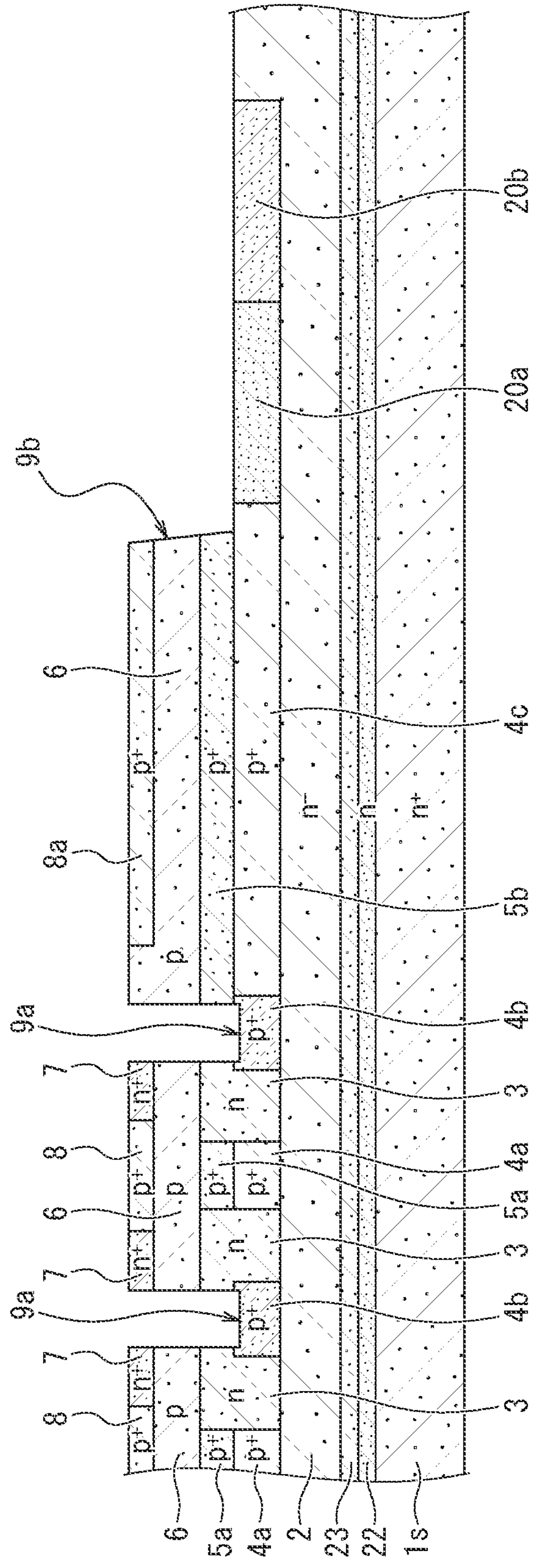
FIG. 12 is a schematic cross-sectional view continued from FIG. 11, for explaining the example of the method of manufacturing the SiC semiconductor device according to the first embodiment.

Next, an oxide film is deposited on the respective top surfaces of the source region 7 and the base contact regions 8 and 8*a*, and the bottom of the mesa groove 9*b* by CVD or the like. A photoresist film is then applied to the top surface of the oxide film, and the oxide film is delineated by photolithography and dry etching, for example. Using the delineated oxide film as a mask for etching, the source region 7, the base region 6, and the n-ion implantation layer 5*p* are partly and selectively removed by dry etching. The oxide film is then removed. This step selectively provides the trenches 9*a* penetrating the source region 7 and the base region 6 to reach the gate bottom protection region 4*b*, as illustrated in FIG. 12. In addition, the n-type current spreading layer 3 implemented by the n-ion implantation layer 3*p* and the n-ion implantation layer 5*p* is formed on the top surface of the drift layer 2.

Next, an oxide film is deposited by CVD or the like. A photoresist film is then applied to the top surface of the oxide film, and is delineated by photolithography or the like. Using the delineated photoresist film as a mask for etching, the oxide film is selectively removed so as to form a field oxide film 10 (refer to FIG. 13) elongated from the bottom of the mesa groove 9*b* along the top surface of the base contact region 8*a*.

Figure 13:
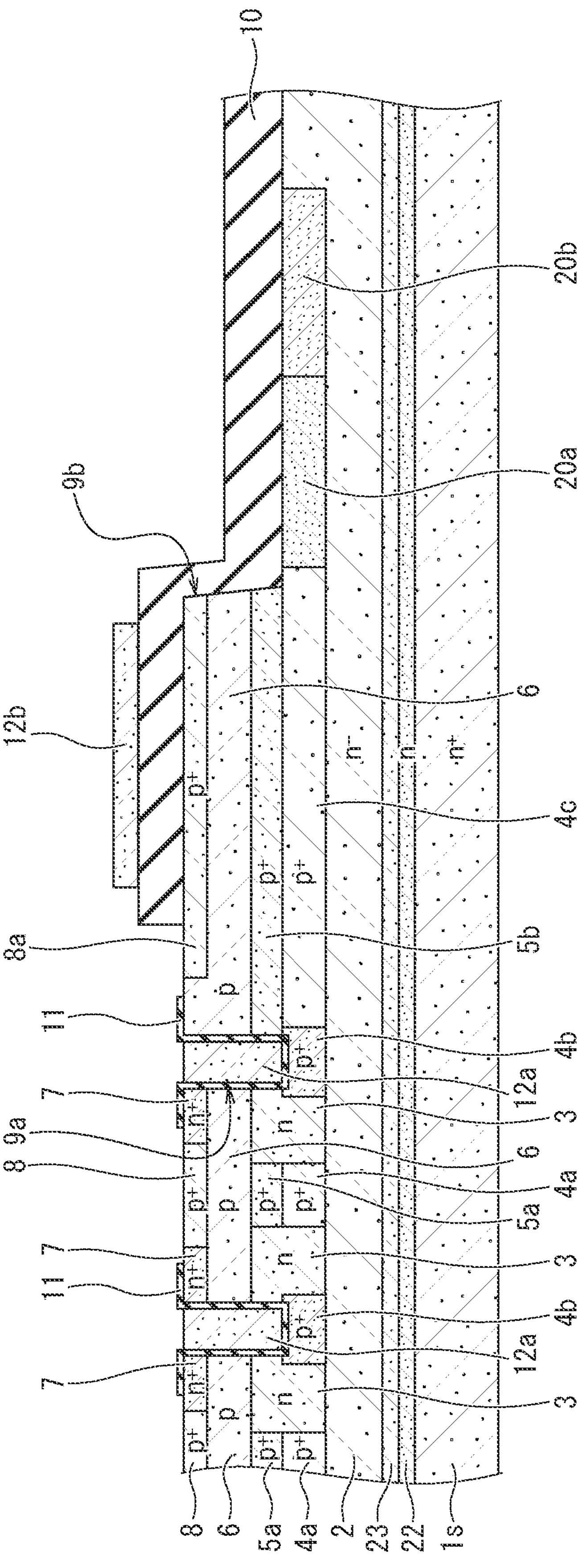
FIG. 13 is a schematic cross-sectional view continued from FIG. 12, for explaining the example of the method of manufacturing the SiC semiconductor device according to the first embodiment.

Next, the gate insulating film 11 (refer to FIG. 13) such as a $SiO_2$ film is formed on the bottom surface and the side surface of the respective trenches 9*a* and the respective top surfaces of the source region 7 and the base contact region 8 by thermal oxidation or CVD, for example. The temperature upon the formation of the gate insulating film 11 is about 1300° C., for example, which is the second highest temperature and lower than that during the activation annealing. Next, a polysilicon layer (a doped polysilicon layer) heavily doped with impurity ions such as phosphorus (P) or boron (B) is deposited so as to fill the respective trenches 9*a* by CVD or the like. The polysilicon layer and the gate insulating film are then partly and selectively removed by photolithography and dry etching, for example. This step provides the insulated gate electrode structure (11, 12*a*) implemented by the gate insulating film 11 and the gate electrode 12*a* of the polysilicon layer, as illustrated in FIG. 13. In addition, the wiring layer 12*b* electrically connected to the gate electrode 12*a* is formed on the top surface of the field oxide film 10 adjacent to the mesa groove 9*b*.

Next, the interlayer insulating film 13 (refer to FIG. 14) is deposited on the top surface of the insulated gate electrode structure (11, 12*a*) by CVD or the like. The interlayer insulating film 13 is then partly and selectively removed by photolithography and dry etching, for example, so as to open source-electrode contact holes, gate-electrode pad contact holes, and gate contact holes.

Next, a metal layer such a Ni film is deposited by sputtering or vapor deposition, for example, and is delineated by photolithography and RIE, for example. The delineated metal layer is then subjected to heat treatment by rapid thermal annealing (RTA) at about 1000° C., for example, so as to form the source contact layer 14 (refer to FIG. 14) on the respective top surfaces of the source region 7 and the base contact region 8. Next, a metal layer such as a TiN film is deposited by sputtering or the like, and is delineated by photolithography and RIE, for example, so as to form the barrier metal layer 15*a* (refer to FIG. 14) to cover the interlayer insulating film 13 and also form the barrier metal layer 15*b* (refer to FIG. 14) on the top surface of the wiring layer 12*b* exposed on the interlayer insulating film 13.

Figure 14:
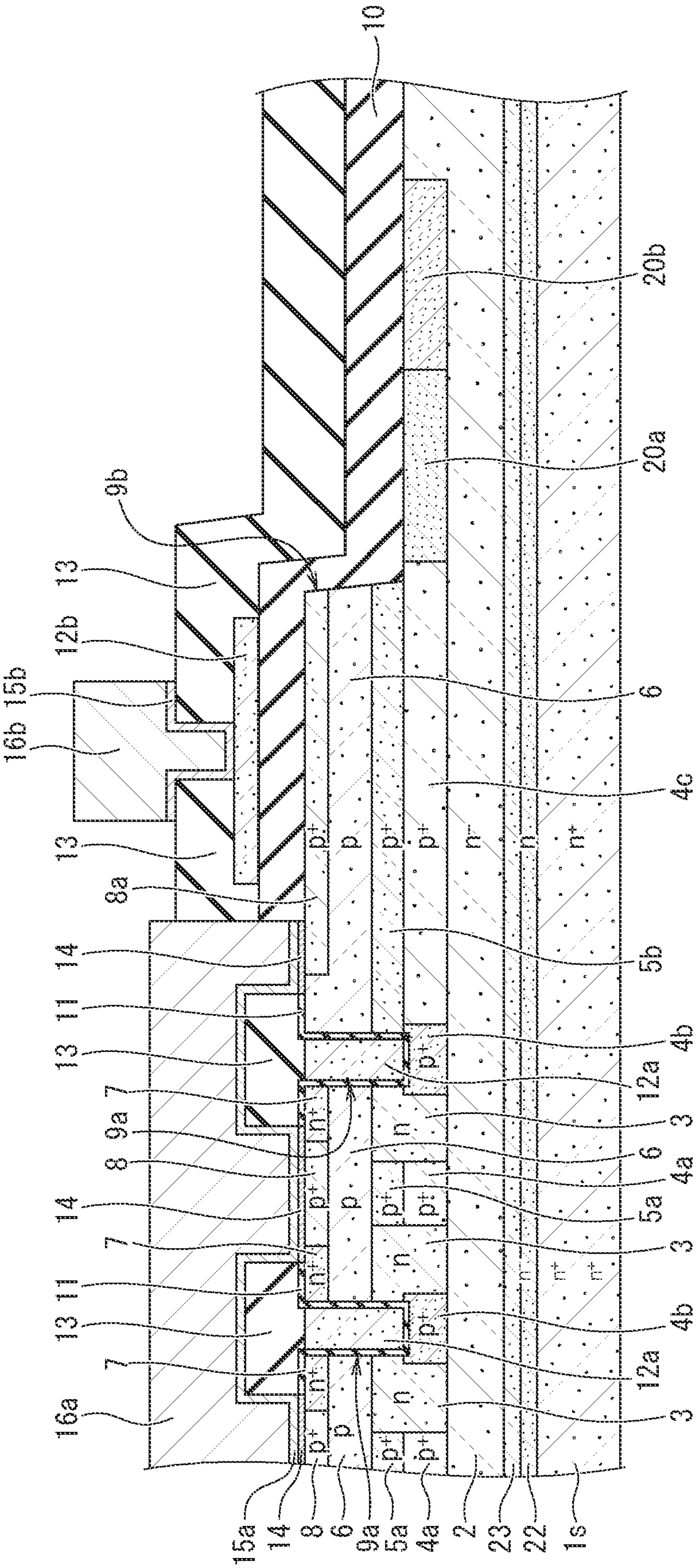
FIG. 14 is a schematic cross-sectional view continued from FIG. 13, for explaining the example of the method of manufacturing the SiC semiconductor device according to the first embodiment.

Next, a metal layer such as an Al film is deposited by sputtering or the like. The metal layer such as an Al film is then delineated by photolithography and RIE, for example. This step provides the pattern including the source electrode 16*a*, the gate electrode pad 16*b*, and the gate surface electrode (not illustrated), as illustrated in FIG. 14.

Figure 15:
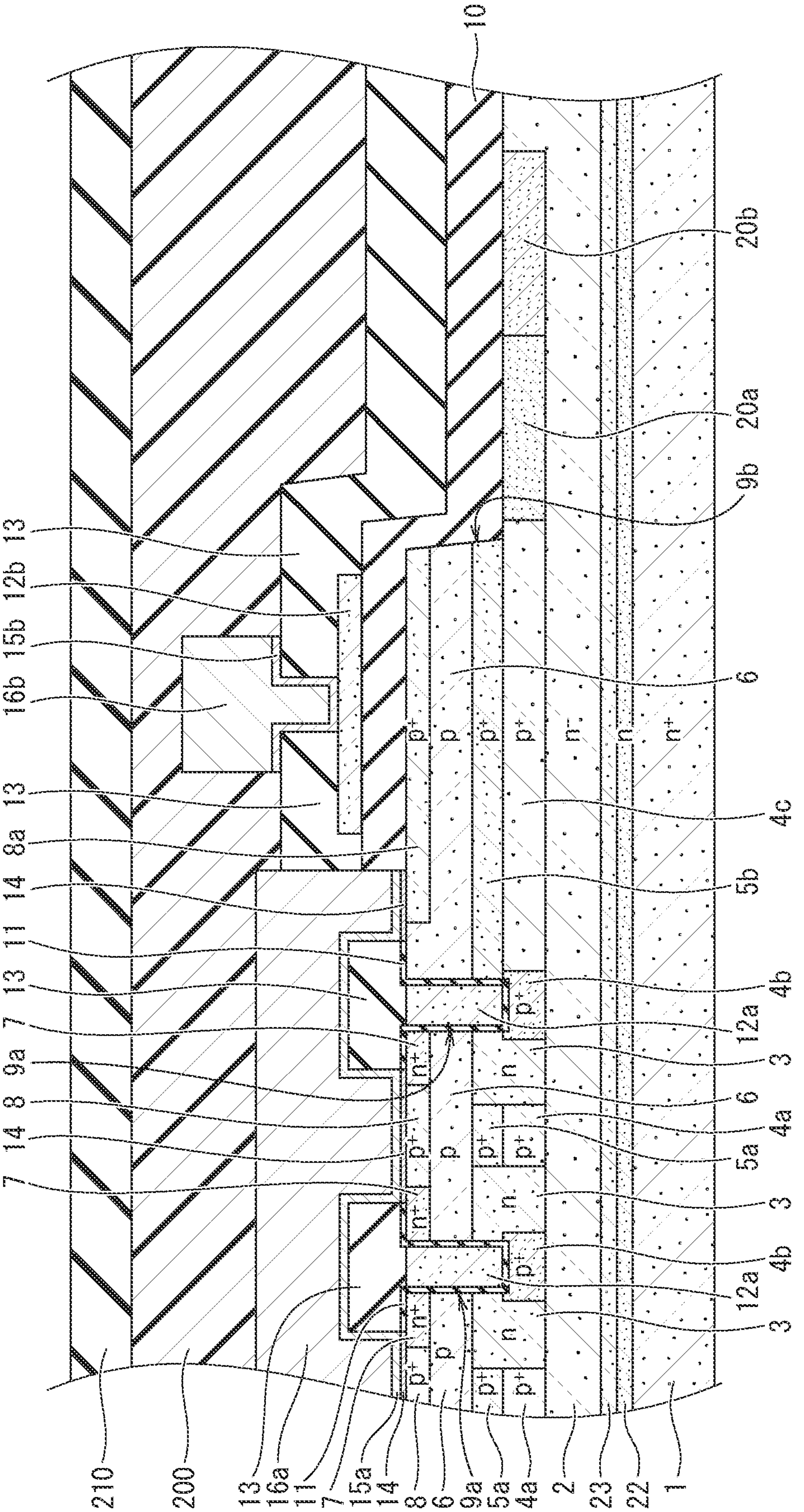
FIG. 15 is a schematic cross-sectional view continued from FIG. 14, for explaining the example of the method of manufacturing the SiC semiconductor device according to the first embodiment.

Next, an adhesive 200 is applied on the top surface side of the substrate 1*s* provided with the element structure so as to be attached to a glass plate 210. The bottom surface of the substrate 1*s* is then polished by chemical mechanical polishing (CMP) to have a thickness adjusted to about 100 micrometers or smaller, more particularly about 50 micrometers, for example, so as to form the drain region 1, as illustrated in FIG. 15. The adhesive 200 is then removed so as to separate the element structure from the glass plate 210.

Thereafter, the drain electrode 17 including Au, for example, is formed on the entire bottom surface of the drain region 1 by sputtering or vapor deposition. The SiC semiconductor device illustrated in FIG. 2 is thus completed.

Example

Figures 16, 17:
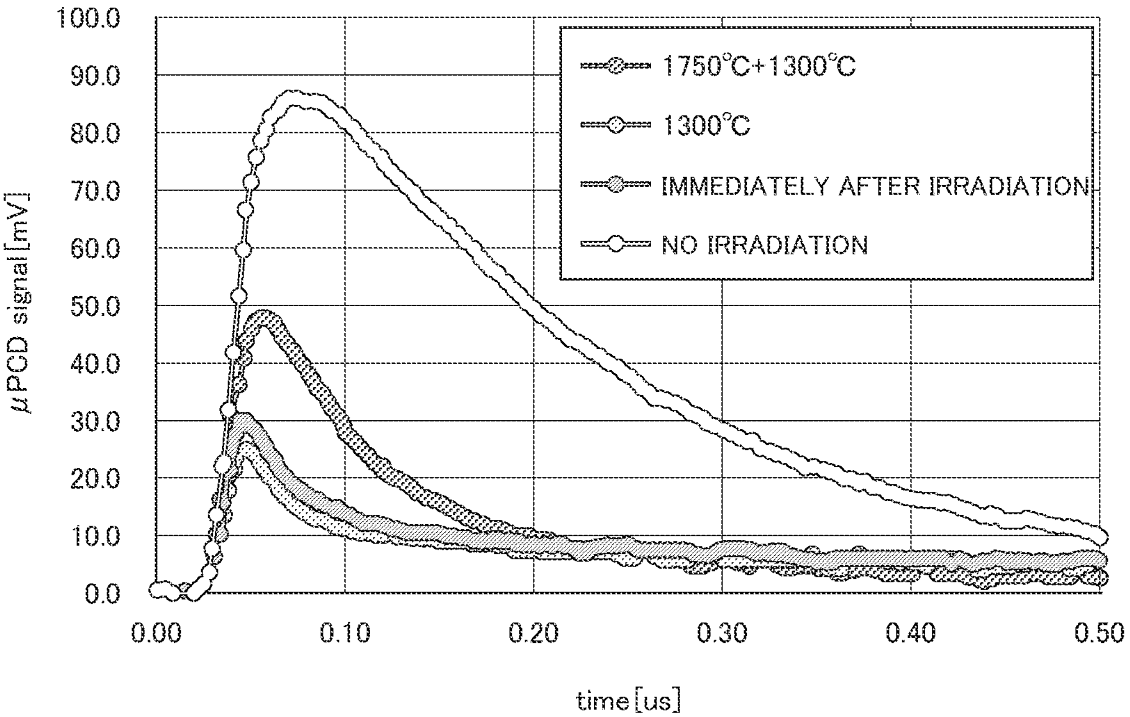
FIG. 16 is a graph showing lifetime measurement results under several conditions regarding SiC.
FIG. 17 is a table showing the lifetime measurement results under the several conditions regarding SiC.

FIG. 16 and FIG. 17 each show measurement results of the lifetime regarding SIC obtained by a microwave photoconductivity decay (μ-PCD) method under the four conditions of "1750° C.+1300° C.", "1300° C.". "immediately after irradiation", and "no irradiation". The condition indicated by "1750° C.+1300° C." corresponds to a case in which SiC is irradiated with helium (He) ions, and is then heated at 1750° C. that is a temperature used for the activation annealing and further heated at 1300° C. that is a temperature used for the formation of the gate insulating film 11, and in which the irradiation with the He ions is presumed to be executed before the activation annealing. The condition indicated by "1300° C." corresponds to a case in which SiC is irradiated with the He ions and is then heated at 1300° C., and in which the irradiation with the He ions is presumed to be executed after the activation annealing and before the formation of the gate insulating film 11. The condition indicated by "immediately after irradiation" corresponds to a case in which SiC is irradiated with the He ions but the following annealing is not executed. The condition indicated by "no irradiation" corresponds to a case in which the irradiation with the He ions is not executed. The acceleration voltage during the irradiation with the He ions under the respective conditions is 23 MeV, and the dose is $1.5\times10^{11}$ $cm^{-2}$.

The axis of abscissas in FIG. 16 indicates the time, and the axis of ordinates indicates a microwave reflection intensity. FIG. 17 is a table showing the effective lifetime that is the time until the microwave reflection intensity decays to 1/e. The measurement results shown in FIG. 16 and FIG. 17 revealed that the lifetime is the shortest under the condition "immediately after irradiation", and the lifetime is also sufficiently short under the respective conditions "1750° C.+1300° C." and "1300° C.".

Effects

The method of manufacturing the SiC semiconductor device according to the first embodiment can accurately irradiate the interface between the dislocation conversion layer 22 and the drift layer 2 with the protons or helium ions as a lifetime killer from the top surface side of the drift layer 2, so as to form the lifetime killer region 23 with high accuracy. This can lead the lifetime killer region 23 to recombine and eliminate the pores efficiently, so as to suppress the extension of the stacking fault. The manufacturing method thus can avoid or decrease the conduction deterioration of the internal diode regardless of whether a large amount of current is applied.

Further, the execution of the step of the irradiation with the lifetime killer illustrated in FIG. 6 before the step of the formation of the gate insulating film 11 illustrated in FIG. 13 can avoid the influence on the gate insulating film 11, so as to prevent a variation in the ON-resistance of the MOSFET, as compared with the case of being executed after the step of the formation of the gate insulating film 11 illustrated in FIG. 13.

Further, the manufacturing method executes the step of the irradiation with the lifetime killer illustrated in FIG. 6 immediately after the step of the growth of the drift layer 2 illustrated in FIG. 5 and before the step of the ion implantation for forming the n-ion implantation layer 3*p* in the drift layer 2 illustrated in FIG. 7. This can avoid or decrease the influence on the mutual interaction with the defect caused by the ion implantation during the ion implantation step and the like for forming the n-ion implantation layer 3*p* in the drift layer 2 illustrated in FIG. 7 or on the change in the concentration upon the ion implantation, as compared with the case of executing the irradiation step after the ion implantation step for forming the n-ion implantation layer 3*p* in the drift layer 2 illustrated in FIG. 7.

Further, the execution of the step of the irradiation with the lifetime killer illustrated in FIG. 6 before the step of the formation of the mesa groove 9*b* in the edge termination region 101*b* illustrated in FIG. 10 can form the flat lifetime killer region 23 at the uniform depth in the entire area of the active region 101*a* and the edge termination region 101*b*, as compared with the case of executing the irradiation step after the step of the formation of the mesa groove 9*b* in the edge termination region 101*b* illustrated in FIG. 10, so as to expect the deterioration suppression effect more reliably.

Further, the execution of the step of the irradiation with the lifetime killer illustrated in FIG. 6 before the step of the formation of the trenches 9*a* illustrated in FIG. 12 can form the flat lifetime killer region 23 in the active region 101*a* with high accuracy without being influenced by the roughness caused by the trenches 9*a*, as compared with the case of executing the irradiation step after the step of the formation of the trenches 9*a* illustrated in FIG. 12.

Modified Example of First Embodiment

The method of manufacturing the SiC semiconductor device according to the first embodiment is illustrated above with the case in which the step of the irradiation with the lifetime killer illustrated in FIG. 6 is executed immediately after the step of the growth of the drift layer 2 illustrated in FIG. 5. Alternatively, the step of the irradiation with the lifetime killer illustrated in FIG. 6 may be executed in any phase after the step of the growth of the drift layer 2 illustrated in FIG. 5 and before the step of the formation of the gate insulating film 11 illustrated in FIG. 13.

For example, the step of the irradiation with the lifetime killer illustrated in FIG. 6 may be executed after the step of the growth of the epitaxially-grown layer 5*e* illustrated in FIG. 9 and before the step of the growth of the epitaxially-grown layer 6*p* illustrated in FIG. 10. If the step of the irradiation with the lifetime killer illustrated in FIG. 6 is executed before the step of the growth of the epitaxially-grown layer 5*e* illustrated in FIG. 9, a thermal history is recorded while an element for recovering the defect is supplied during the growth of the epitaxially-grown layer 5*e*, and the amount of recovery of the defect is increased and is thus influenced by the variation of the growth conditions. To deal with this, the execution of the step of the irradiation with the lifetime killer illustrated in FIG. 6 after the step of the growth of the epitaxially-grown layer 5*e* illustrated in FIG. 9 can decrease the amount of recovery of the defect by the step of the growth of the epitaxially-grown layer 5*e* illustrated in FIG. 9, so as to eliminate the influence of the variation of the growth conditions on the recovery amount.

Alternatively, the step of the irradiation with the lifetime killer illustrated in FIG. 6 may be executed after the step of the growth of the epitaxially-grown layer 6*p* illustrated in FIG. 10. This case can decrease the amount of recovery of the defect by each of the step of the growth of the epitaxially-grown layer 5*e* illustrated in FIG. 9 and the step of the growth of the epitaxially-grown layer 6*p* illustrated in FIG. 10, so as to eliminate the influence of the variation of the growth conditions on the recovery amount, as compared with the case of the execution of the irradiation step before the step of the growth of the epitaxially-grown layer 6*p* illustrated in FIG. 10.

Alternatively, the step of the irradiation with the lifetime killer illustrated in FIG. 6 may be executed before the step of the formation of the mesa groove 9*b* in the edge termination region 101*b* illustrated in FIG. 10. This case can form the flat lifetime killer region 23 at the uniform depth in the entire area of the active region 101*a* and the edge termination region 101*b*, so as to expect the deterioration suppression effect more reliably, as compared with the case of the execution of the irradiation step after the step of the formation of the mesa groove 9*b* in the edge termination region 101*b* illustrated in FIG. 10.

Alternatively, the step of the irradiation with the lifetime killer illustrated in FIG. 6 may be executed after the step of the ion implantation for forming the source region 7 and the respective base contact regions 8 and 8*a* illustrated in FIG. 11 and before the step of the activation annealing after this ion implantation step. This case can eliminate a probability that the defect could float because of the photolithography or the ion implantation during the ion implantation step illustrated in FIG. 11 caused by a warp generated during the irradiation with the lifetime killer, as compared with the case of the execution of the irradiation step before the ion implantation step for forming the source region 7 and the respective base contact regions 8 and 8*a* illustrated in FIG. 11. This case can also relax a stress due to the activation annealing, so as to reduce the influence of a warp generated during the irradiation with the lifetime killer, as compared with the case of the execution of the irradiation step after the activation annealing step after the ion implantation step illustrated in FIG. 11.

Alternatively, the step of the irradiation with the lifetime killer illustrated in FIG. 6 may be executed before the step of the formation of the trenches 9*a* illustrated in FIG. 12. This case can form the flat lifetime killer region 23 in the active region 101*a* with high accuracy without being influenced by the roughness caused by the trenches 9*a*, as compared with the case of the execution of the irradiation step after the step of the formation of the trenches 9*a* illustrated in FIG. 12.

Alternatively, the step of the irradiation with the lifetime killer illustrated in FIG. 6 may be executed after the step of the formation of the trenches 9*a* illustrated in FIG. 12 and before the step of the formation of the gate insulating film 11 illustrated in FIG. 13. This case can avoid an influence on the gate insulating film 11, so as to suppress a fluctuation in the gate threshold, as compared with the case of the execution of the irradiation step after the step of the formation of the gate insulating film 11 illustrated in FIG. 13.

Second Embodiment

Figure 18:
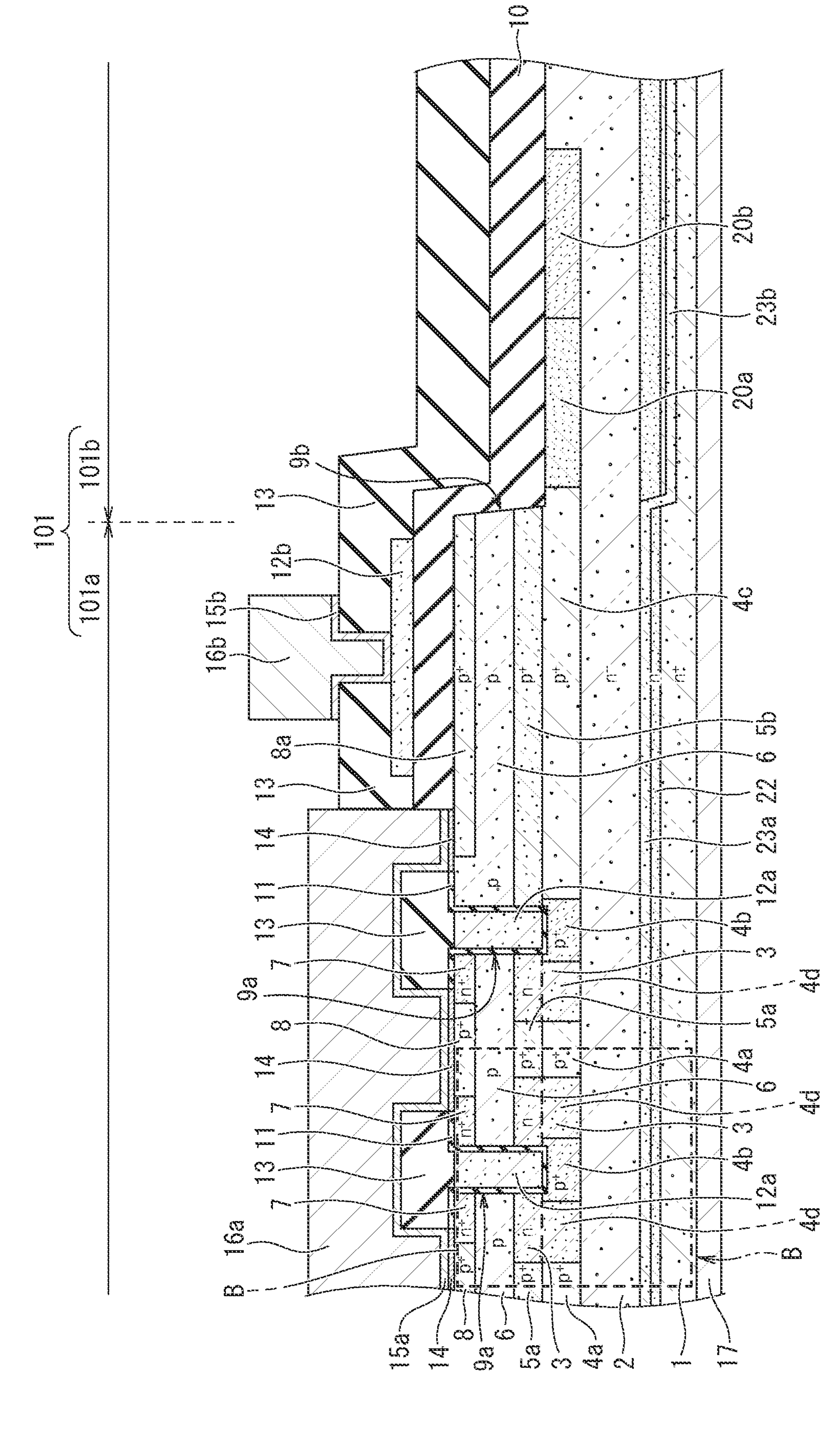
FIG. 18 is a schematic cross-sectional view illustrating an example of a SiC semiconductor device according to a second embodiment.

A SiC semiconductor device according to a second embodiment differs from the SiC semiconductor device according to the first embodiment illustrated in FIG. 2 in including lifetime killer regions 23*a* and 23*b* that are not uniform along the region across the active region 101*a* and the edge termination region 101*b*, as illustrated in FIG. 18. The lifetime killer region 23*a* in the active region 101*a* is provided to be uniformly flat at a depth equal to the lifetime killer region 23 illustrated in FIG. 2.

The lifetime killer region 23*b* in the edge termination region 101*b* is provided to be uniformly flat at a depth deeper than the lifetime killer region 23*a* in the active region 101*a*. The lifetime killer region 23*b* in the edge termination region 101*b* is arranged inside the drain region 1, for example. The other configurations of the SiC semiconductor device according to the second embodiment are substantially the same as those of the SiC semiconductor device according to the first embodiment illustrated in FIG. 2, and overlapping explanations are not repeated below.

A method of manufacturing the SiC semiconductor device according to the second embodiment includes a step of irradiating the top surface of the drift layer 2 with the protons or helium ions as a lifetime killer after the step of forming the mesa groove 9*b* in the edge termination region 101*b* illustrated in FIG. 10 and before the step of forming the gate insulating film 11 illustrated in FIG. 13, as described in the method of manufacturing the SiC semiconductor device according to the first embodiment, so as to form the respective lifetime killer regions 23*a* and 23*b*.

Figure 19:
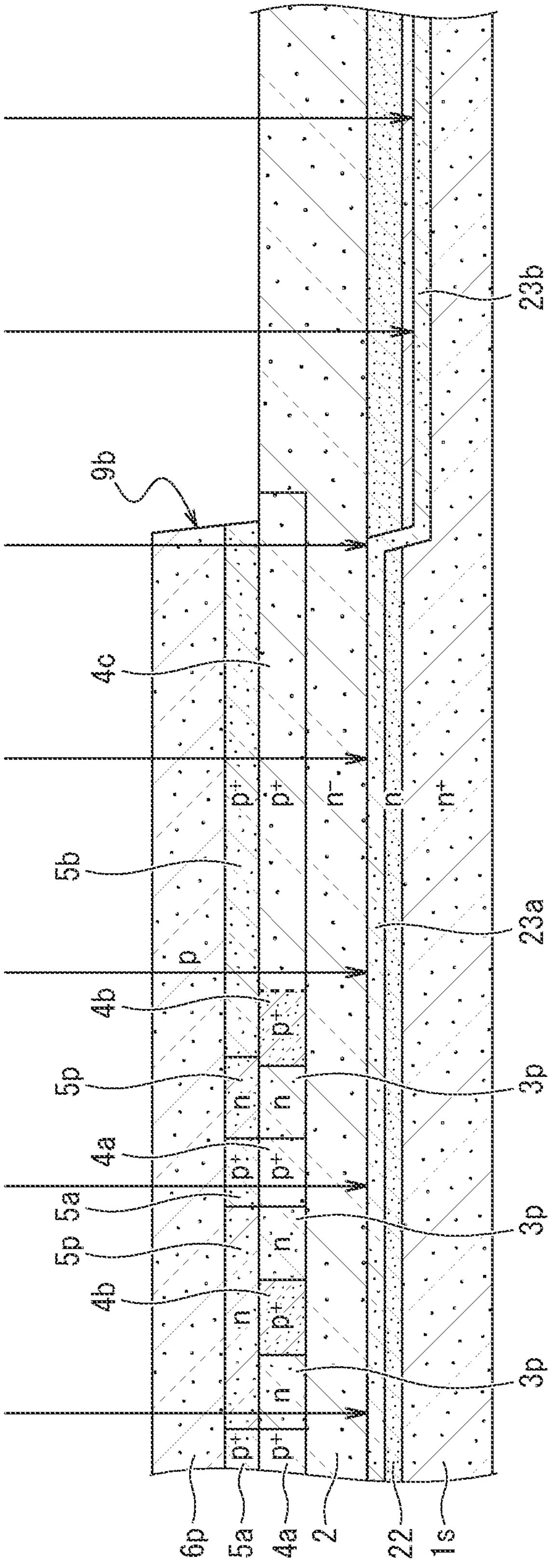
FIG. 19 is a schematic cross-sectional view for explaining an example of a method of manufacturing the SiC semiconductor device according to the second embodiment.

For example, as illustrated in FIG. 19, the irradiation with the protons or helium ions as a lifetime killer from the top surface side of the drift layer 2 may be executed immediately after the step of forming the mesa groove 9*b* in the edge termination region 101*b* and before the step of the ion implantation for forming the source region 7, the base contact regions 8 and 8*a*, and the electric-field relaxation regions 20*a* and 20*b* illustrated in FIG. 11. At this point, the bottom of the mesa groove 9*b* provided in the edge termination region 101*b* is located at a depth deeper than the top surface of the active region 101*a*. The lifetime killer region 23*b* in the edge termination region 101*b* is thus located at a deeper position than the lifetime killer region 23*a* in the active region 101*a* so as to correspond to the shape of the mesa groove 9*b*.

Figure 20:
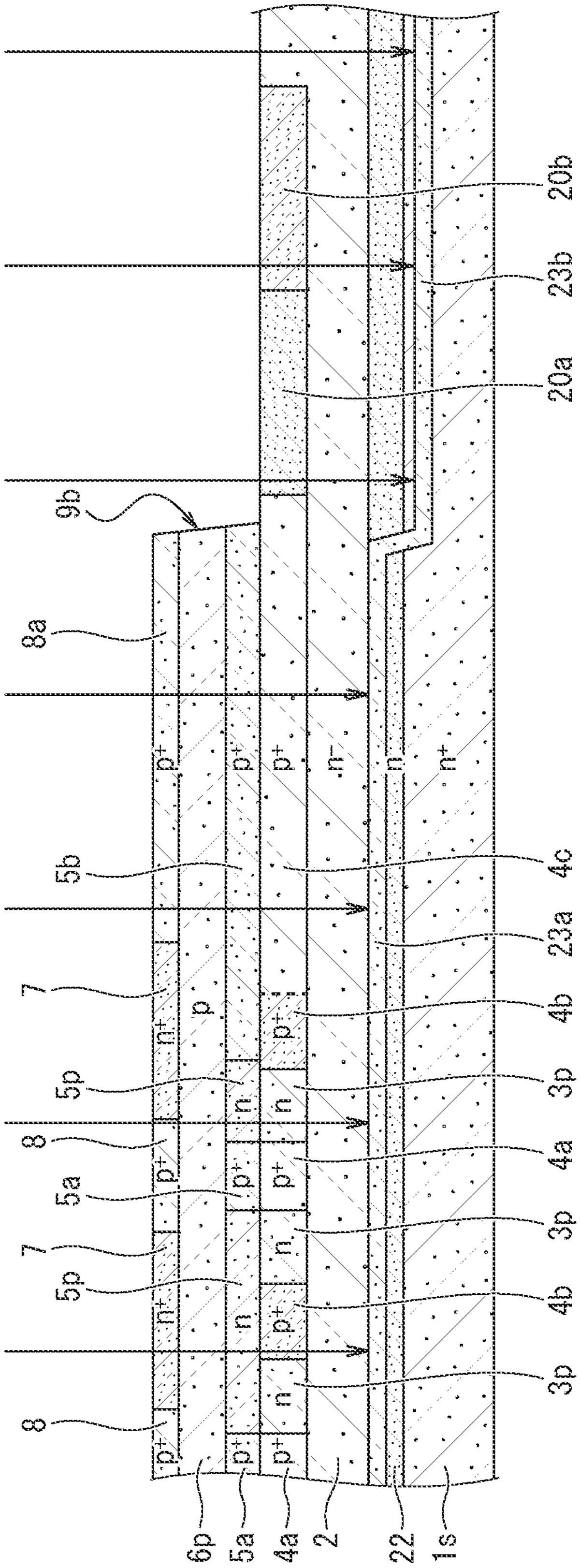
FIG. 20 is another schematic cross-sectional view for explaining the example of the method of manufacturing the SiC semiconductor device according to the second embodiment.

Alternatively, as illustrated in FIG. 20, the irradiation with the protons or helium ions as a lifetime killer from the top surface side of the drift layer 2 may be executed after the step of the ion implantation for forming the source region 7, the base contact regions 8 and 8*a*, and the electric-field relaxation regions 20*a* and 20*b* or after the following activation annealing. This case also provides the mesa groove 9*b* in the edge termination region 101*b* at a position deeper than the lifetime killer region 23*a* in the active region 101*a*. The other steps in the method of manufacturing the SiC semiconductor device according to the second embodiment are substantially the same as those in the method of manufacturing the SiC semiconductor device according to the first embodiment, and overlapping explanations are not repeated below.

The SiC semiconductor device and the method of manufacturing the SiC semiconductor device according to the second embodiment can accurately form the lifetime killer region 23*a* in the active region 101*a* to cover the interface between the dislocation conversion layer 22 and the drift layer 2, so as to avoid or decrease the conduction deterioration of the internal diode and the variation in the ON-resistance of the active element, as in the case of the SiC semiconductor device and the method of manufacturing the SiC semiconductor device according to the first embodiment. Further, the present embodiment can decrease the amount of recovery of the defect during the growing step, as in the case of the irradiation after the step of growing the epitaxially-grown layer 6*p* in the first embodiment, so as to eliminate the influence of variation of the growth conditions on the recovery amount.

Third Embodiment

Figure 21:
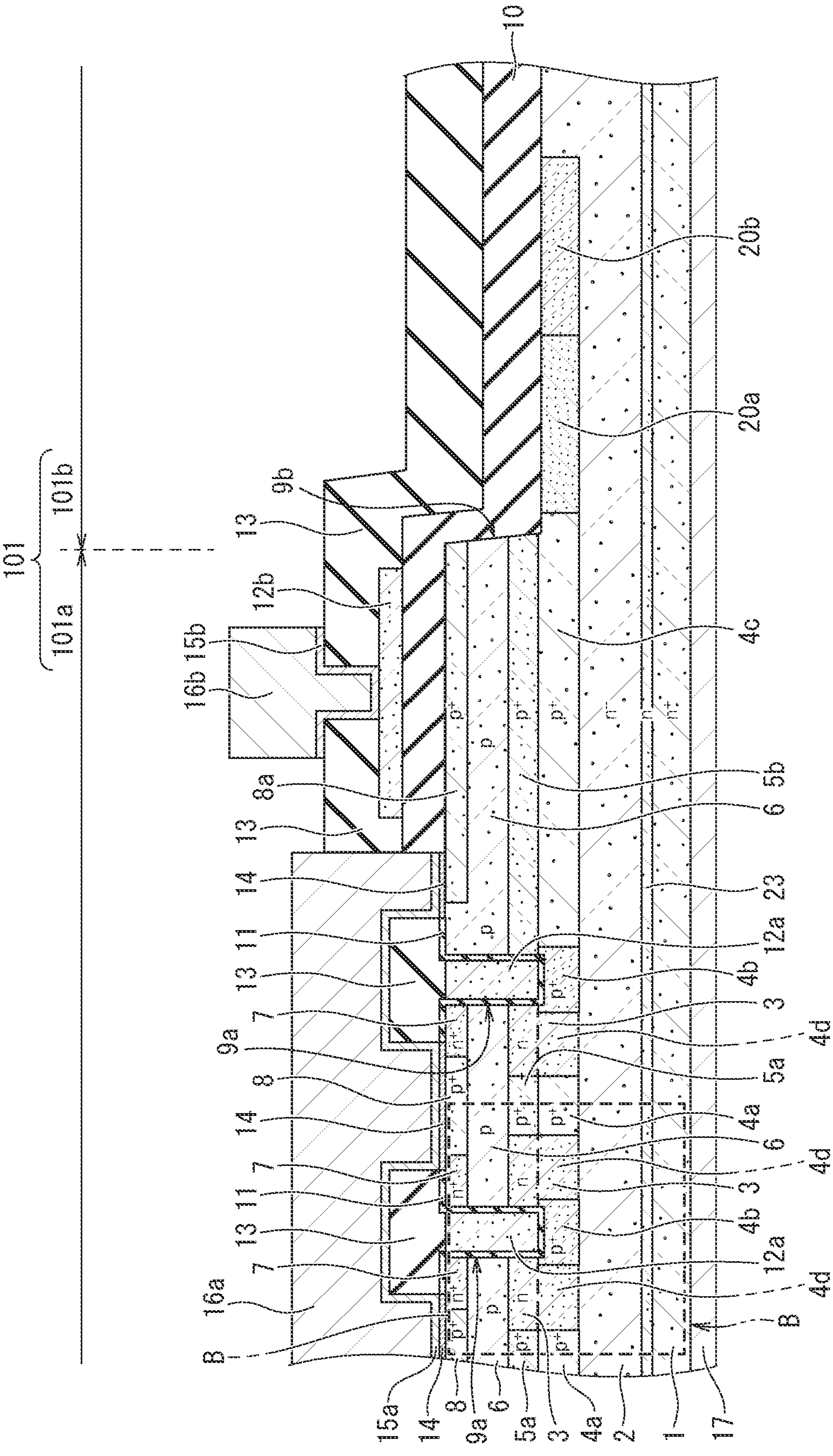
FIG. 21 is a schematic cross-sectional view illustrating an example of a SiC semiconductor device according to a third embodiment.

A SiC semiconductor device according to a third embodiment differs from the SiC semiconductor device according to the first embodiment illustrated in FIG. 2 in not including the dislocation conversion layer 22 between the drain region 1 and the drift layer 2, as illustrated in FIG. 21. The lifetime killer region 23 is provided between the drain region 1 and the drift layer 2. The lifetime killer region 23 is arranged to cover the bottom surface of the drift layer 2, which is the interface between the drain region 1 and the drift layer 2.

Figure 22:
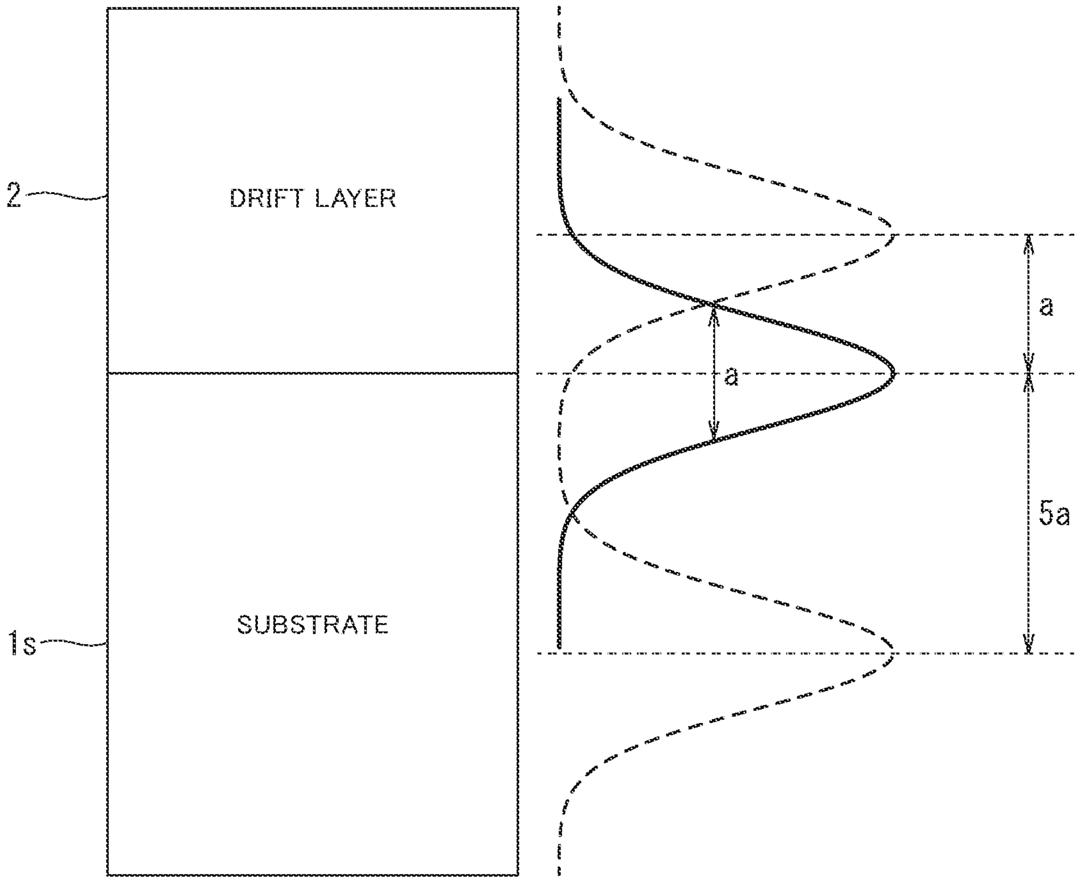
FIG. 22 is a schematic view illustrating an irradiation range of a lifetime killer in the SiC semiconductor device according to the third embodiment.

FIG. 22 on the left side schematically illustrates a positional relation between the substrate 1*s* of the drain region 1 and the drift layer 2 in the depth direction before the lifetime killer region 23 is formed. As illustrated on the left side in FIG. 22, the bottom surface of the drift layer 2 is in contact with the top surface of the substrate 1*s*.

FIG. 22 on the right side schematically shows a concentration profile of the point defect made by hydrogen or helium included in the lifetime killer region 23 in the depth direction corresponding to the left side in FIG. 22. When the dislocation conversion layer is not provided between the substrate 1*s* and the drift layer 2 as illustrated on the left side in FIG. 22, a peak of the concentration of the point defect made by hydrogen or helium included in the lifetime killer region 23 in the depth direction is preferably located toward the top surface side of the substrate 1*s*. Adjusting the peak to this position can avoid an influence of hydrogen or helium on the gate insulating film 11 while allowing the lifetime killer region 23 to sufficiently ensure the function of recombining the holes.

The broken line shown on the right side in FIG. 22 indicates an allowable maximum displacement width of the peak position of concentration of the point defect made by hydrogen or helium included in the lifetime killer region 23 in the depth direction. The peak position of concentration of the point defect made by hydrogen or helium included in the lifetime killer region 23 in the depth direction may be set within a range from a position inside the drift layer 2 shallower than the interface between the substrate 1*s* and the drift layer 2 by the full width at half maximum “a” of the concentration of the point defect made by hydrogen or helium to a position inside the substrate 1*s* deeper than the interface between the substrate 1*s* and the drift layer 2 by five times as large as the full width at half maximum “a”. The other configurations of the SiC semiconductor device according to the third embodiment are substantially the same as those of the SiC semiconductor device according to the first embodiment illustrated in FIG. 2, and overlapping explanations are not repeated below.

A method of manufacturing the SiC semiconductor device according to the third embodiment includes a step of epitaxially growing the drift layer 2 on the substrate 1*s* without epitaxially growing the dislocation conversion layer 22 illustrated in FIG. 5 on the substrate 1*s* described in the method of manufacturing the SiC semiconductor device according to the first embodiment. The manufacturing method further includes a step of forming the lifetime killer region 23 by irradiating the top surface side of the drift layer 2 with protons or helium ions after the step of growing the drift layer 2 and before the step of forming the gate insulating film 11 illustrated in FIG. 13, as in the case of the method of manufacturing the SiC semiconductor device according to the first embodiment. The other steps in the method of manufacturing the SiC semiconductor device according to the third embodiment are substantially the same as those in the method of manufacturing the SiC semiconductor device according to the first embodiment, and overlapping explanations are not repeated below.

The SiC semiconductor device and the method of manufacturing the SiC semiconductor device according to the third embodiment can accurately form the lifetime killer region 23 so as to cover the interface between the drain region 1 and the drift layer 2, regardless of whether the dislocation conversion layer 22 is not provided between the drain region 1 and the drift layer 2, so as to avoid or decrease the conduction deterioration of the internal diode and the variation in the ON-resistance of the active element, as in the case of the SiC semiconductor device and the method of manufacturing the SiC semiconductor device according to the first embodiment.

OTHER EMBODIMENTS

As described above, the invention has been described according to the first to third embodiments, but it should not be understood that the description and drawings implementing a portion of this disclosure limit the invention. Various alternative embodiments of the present invention, examples, and operational techniques will be apparent to those skilled in the art from this disclosure.

For example, while the first to third embodiments have been illustrated above with the case of using the trench gate SiC semiconductor device, the present invention can be applied to a planar gate SiC semiconductor device. The present invention can also be applied to a semiconductor device including a wide bandgap semiconductor other than SiC.

Further, the configurations disclosed in the first to third embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present specification.

What is claimed is:

1. A silicon carbide semiconductor device comprising:
- a drift layer of a first conductivity-type provided on a top surface side of a silicon carbide substrate of the first conductivity-type;
- a base region of a second conductivity-type provided on a top surface side of the drift layer;
- a main region of the first conductivity-type provided on the top surface side of the drift layer so as to be in contact with the base region;
- an insulated gate electrode structure provided to be in contact with the main region and the base region;
- a buffer layer of the first conductivity-type provided between the silicon carbide substrate and the drift layer; and
- a lifetime killer region provided to cover a bottom surface of the drift layer and including a recombination center having a point defect,
- wherein a concentration peak of a concentration profile of the point defect in a depth direction is located:
  - inside the drift layer,
  - inside the buffer layer, or
  - inside the silicon carbide substrate.

2. The silicon carbide semiconductor device of claim 1, wherein the concentration peak is located inside the silicon carbide substrate under an interface between the silicon carbide substrate and the drift layer.

3. The silicon carbide semiconductor device of claim 1, wherein:
- a mesa groove is provided in an edge termination region provided at a circumference of an active region provided with the insulated gate electrode structure; and
- the lifetime killer region is flat from the active region to the edge termination region.

4. The silicon carbide semiconductor device of claim 1, wherein:
- a mesa groove is provided in an edge termination region provided at a circumference of an active region provided with the insulated gate electrode structure; and
- the lifetime killer region in the edge termination region is provided at a deeper position than the lifetime killer region in the active region.

5. The silicon carbide semiconductor device of claim 1, wherein
- the concentration peak is located in a range of:
  - shallower than an interface between the buffer layer and the drift layer by a first distance, the first distance corresponding to a full width at half maximum (FWHM) of the concentration peak, and
  - deeper than the interface by a second distance, the second distance corresponding to five times the FWHM,
  - wherein the range is inclusive of end points.

6. The silicon carbide semiconductor device of claim 1, wherein the concentration peak is located between an interface between the buffer layer and the drift layer and a distance shallower than the interface by a distance corresponding to a full width at half maximum of the concentration peak.

7. The silicon carbide semiconductor device of claim 1, wherein the concentration peak is located between an interface between the buffer layer and the drift layer and a distance deeper than the interface by a distance corresponding to five times a full width at half maximum of the concentration peak.

8. A silicon carbide semiconductor device comprising:
- a drift layer of a first conductivity-type provided on a top surface side of a silicon carbide substrate of the first conductivity-type;
- a base region of a second conductivity-type provided on a top surface side of the drift layer;
- a main region of the first conductivity-type provided on the top surface side of the drift layer so as to be in contact with the base region;
- an insulated gate electrode structure provided to be in contact with the main region and the base region;
- a lifetime killer region provided to cover a bottom surface of the drift layer and including a recombination center having a point defect; and
- a buffer layer of the first conductivity-type provided between the silicon carbide substrate and the drift layer and having a higher impurity concentration than the drift layer,
- wherein a peak position of a concentration of the point defect in a depth direction is located inside the buffer layer.

9. A method of manufacturing a silicon carbide semiconductor device, comprising:

epitaxially growing a drift layer of a first conductivity-type on a top surface side of a silicon carbide substrate of the first conductivity-type;

forming a base region of a second conductivity-type on a top surface side of the drift layer;

forming a main region of the first conductivity-type on the top surface side of the drift layer so as to be in contact with the base region;

forming a gate insulating film so as to be in contact with the base region and the main region;

forming a gate electrode so as to be in contact with the base region and the main region with the gate insulating film interposed: and forming a lifetime killer region at a depth covering a bottom surface of the drift layer by irradiating the top surface side of the drift layer with a lifetime killer after the epitaxially growing the drift layer and before the forming the gate insulating film.

10. The method of manufacturing the silicon carbide semiconductor device of claim 9, wherein the lifetime killer is protons or helium ions.

11. The method of manufacturing the silicon carbide semiconductor device of claim 9, further comprising forming a trench penetrating the base region and the main region, wherein the forming the lifetime killer region is executed before the forming the trench.

12. The method of manufacturing the silicon carbide semiconductor device of claim 9, further comprising executing activation annealing for activating impurity ions implanted into the base region and the main region, wherein the forming the lifetime killer region is executed before the executing the activation annealing.

13. The method of manufacturing the silicon carbide semiconductor device of claim 9, wherein the forming the lifetime killer region is executed immediately after the epitaxially growing the drift layer.

14. The method of manufacturing the silicon carbide semiconductor device of claim 9, further comprising forming a mesa groove in an edge termination region provided at a circumference of an active region provided with the gate electrode, wherein the forming the lifetime killer region is executed before the forming the mesa groove.

15. The method of manufacturing the silicon carbide semiconductor device of claim 9, further comprising forming a mesa groove in an edge termination region provided at a circumference of an active region provided with the gate insulating film and the gate electrode, wherein the forming the lifetime killer region is executed after the forming the mesa groove.

16. The method of manufacturing the silicon carbide semiconductor device of claim 9, further comprising forming a buffer layer of the first conductivity-type having a higher impurity concentration than the drift layer on the silicon carbide substrate before the epitaxially growing the drift layer.

17. The method of manufacturing the silicon carbide semiconductor device of claim 10, wherein a dose of the protons or helium ions is $1\times10^{10}$ $cm^{-2}$ or greater and $2\times10^{12}$ $cm^{-2}$ or smaller.

* * * * *